(12) United States Patent
Miura et al.

(10) Patent No.: US 8,294,213 B2
(45) Date of Patent: Oct. 23, 2012

(54) SEMICONDUCTOR PHOTODIODE DEVICE AND MANUFACTURING METHOD THEREOF

(75) Inventors: Makoto Miura, Tsukuba (JP); Shinichi Saito, Kawasaki (JP); Youngkun Lee, Hachioji (JP); Katsuya Oda, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 173 days.

(21) Appl. No.: 12/838,445

(22) Filed: Jul. 17, 2010

(65) Prior Publication Data
US 2011/0031529 A1 Feb. 10, 2011

(30) Foreign Application Priority Data

Aug. 6, 2009 (JP) ................. 2009-182990

(51) Int. Cl.
H01L 21/00 (2006.01)
H01L 21/331 (2006.01)
H01L 27/12 (2006.01)
(52) U.S. Cl. ........ 257/347; 257/466; 257/184; 257/527; 257/233; 438/164; 438/341; 438/150; 438/198
(58) Field of Classification Search .................. 257/347, 257/466, 184, 527, 233; 438/164, 341, 150, 438/198
See application file for complete search history.

(56) References Cited

U.S. PATENT DOCUMENTS

| 6,015,979 | A | 1/2000 | Sugiura et al. |
| 6,130,457 | A * | 10/2000 | Yu et al. ........................ 257/347 |
| 7,081,639 | B2 * | 7/2006 | Uchida et al. ................... 257/21 |
| 2005/0098234 | A1 | 5/2005 | Nakaharai et al. |
| 2007/0099329 | A1 | 5/2007 | Maa et al. |
| 2011/0031578 | A1 * | 2/2011 | Miura et al. ................... 257/462 |

FOREIGN PATENT DOCUMENTS

| JP | 2000-21789 A | 1/2000 |
| JP | 2005-142217 A | 6/2005 |
| JP | 2006-513584 T | 4/2006 |
| JP | 2007-123852 A | 5/2007 |
| WO | WO 2004/061911 A2 | 7/2004 |

OTHER PUBLICATIONS

Hsin-Chiao Luan et al. "High-quality Ge epilayers on Si with Low threading-dislocation densities", Applied Physics Letters, vol. 75, No. 19, Nov. 8, 1999, pp. 2909-2911.

(Continued)

*Primary Examiner* — Jarrett Stark
*Assistant Examiner* — Nicholas Tobergte
(74) *Attorney, Agent, or Firm* — Miles & Stockbridge P.C.

(57) ABSTRACT

A semiconductor photodiode device includes a semiconductor substrate, a first buffer layer containing a material different from that of the semiconductor substrate in a portion thereof, a first semiconductor layer formed above the buffer layer and having a lattice constant different from that of the semiconductor substrate, a second buffer layer formed above the first semiconductor layer and containing an element identical with that of the first semiconductor layer in a portion thereof, and a second semiconductor layer formed above the buffer layer in which a portion of the first semiconductor layer is formed of a plurality of island shape portions each surrounded with an insulating film, and the second buffer layer allows adjacent islands of the first semiconductor layer to coalesce with each other and is in contact with the insulating film.

18 Claims, 35 Drawing Sheets

OTHER PUBLICATIONS

Shu Nakaharai et al., "Characterization of 7-nm-thick strained Ge-on-insulator layer fabricated by Ge-condensation technique", Applied Physics Letters, vol. 83, No. 17, Oct. 27, 2003, pp. 3516-3518.

Tsutomu Tezuka et al., "Dislocation-free relaxed SiGe-on-insulator mesa structures fabricated by high-temperature oxidation", Journal of Applied Physics, vol. 94, No. 12, Dec. 15, 2003, pp. 7553-7559.

T. A. Langdo, "High quality Ge on Si by epitaxial necking", Applied Physics Letters, vol. 76, No. 25, Jun. 19, 2000, pp. 3700-3702.

* cited by examiner 201 202 203 204

201 202 205 206

401  402  403  404

401  402  405  406

501  502  504 505

501  502  504 505

701   702  703    704

SEMICONDUCTOR PHOTODIODE DEVICE AND MANUFACTURING METHOD THEREOF

CLAIM OF PRIORITY

The present application claims priority from Japanese patent application JP 2009-182990 filed on Aug. 6, 2009, the content of which is hereby incorporated by reference into this application.

FIELD OF THE INVENTION

The present invention concerns a semiconductor photodiode device which is a photodiode device using a semiconductor containing germanium and a manufacturing method thereof and it particularly relates to a semiconductor photodiode device such as a germanium photodiode device of low defect density and a manufacturing method thereof.

BACKGROUND OF THE INVENTION

As a method of epitaxially growing Ge of low defect density on Si, a method of applying a low temperature buffer layer has been known (for example, refer to H-C. Luan, D. R. Lim, K. K. Lee, K. M. Chen, J. G. Sandland, K. Wada and L. C. Kimerling, Appl. Phys. Lett., 1999, vol. 75, pp. 2909-2911).

Further, as another method of forming a Ge layer of low defect density on an Si substrate, an enriched oxidation process has been known (for example, refer to JP-A-2005-142217, and S. Nakaharai, T. Tezuka, N. Sugiyama, Y. Moriyama, and S. Takagi, Appl. Phys. Lett., 2003, vol. 83, pp. 3516 to 3518).

Further, a method of enhancing the crystallinity of a Ge layer by improving the enriched oxidation process has been known (for example, refer to T. Tezuka, N. Sugiyama, and S. Takagi, J. Appl. Phys., 2003, vol. 94, pp. 7553 to 7559).

Further, as a technique of using an epitaxial lateral growth (ELO), a method of growing gallium nitride (GaN) on a sapphire substrate by ELO has been known (for example, refer to JP-A-2000-021789).

Further, a method of growing Ge on Si by ELO has been known (for example, refer to T. A. Lango, C. W. Leitz, M. T. Currie, E. A. Fitzgerald, A. Lochtefeld, and D. A. Antoniadis, Appl. Phys. Lett., 2000, vol. 76, pp. 3700 to 3702).

Further, in a case of manufacturing a Ge photodiode device by utilizing the ELO technique, a method of avoiding coalescence of Ge layers to each other grown from each of by ELO has been known (for example, refer to JP-T-2006-513584 and JP-A-2007-123852).

SUMMARY OF THE INVENTION

Optical communication has become predominant in broad band networks of internets that form a part of the foundation of modern information society. In the optical communication system, near infrared (IR) light within a range of 800 nm to 1600 nm is used. A particularly important wavelength band is a band where loss of optical fibers becomes minimum, and 850 nm is used for short distant communication and 1300 nm and 1550 nm are used for long distance communication. For photodiode devices in the optical communication, compound semiconductors, mainly, gallium arsenide (GaAs) and indium phosphide (InP) having good light absorbing characteristics in the long wavelength band have been used. However, for further popularization of future optical communication system, it is essential to reduce the cost and the size and, further, improve the performance of apparatus, and technical innovation is demanded also for the photodiode devices in order to attain such demands.

Means for addressing the subject described above includes integration of a photodiode device on a silicon chip. With respect to silicon (Si), refinement and high integration of transistors have been progressed under the background of matured process techniques and this is a material indispensable for integrated circuits. When a technique of hybridizing the photodiode device on Si can be established, integration circuits and optical devices can be integrated on one chip, which can solve the subject described above and enable higher function and higher value addition, and it is expected to bring about remarkable industrial innovation. As a method of hybridizing the photodiode device on Si, while it may be considered a technique of bonding a compound semiconductor on an Si substrate or a method of growing crystals of a compound semiconductor on the Si substrate. However, since a large difference of the thermal expansion coefficient and the lattice constant present between the compound semiconductor and Si, or the electric polarity of the compound semiconductor deteriorates the crystallinity of the compound semiconductor, there is a high technical barrier. If Si or Si type group IV semiconductor has a photoreceiving function, the process barrier is lowered outstandingly and optical device/electronic device can be fused easily.

However, Si has a band gap of about 1.1 eV at a room temperature and scarcely absorbs light at a wavelength of 1100 nm or more. The absorption is poor also for the light at 850 nm, and the absorption length defined by a distance where the amount of an absorbed light is decayed to 1/e layer than is 20 μm and it is difficult to use Si as a practical device. On the contrary, germanium (Ge) also belonging to the same group IV semiconductor as Si has a band gap as small as about 0.6 eV at a room temperature and can absorb a light up to 1600 nm. FIG. 2 shows a graph plotting the absorption length to the wavelength of light on various materials. Ge has an absorption length of 2 μm or less in a wavelength region of 800 nm to 1600 nm and can form a practical photodiode device. Further, since it belongs to the same group IV semiconductor as Si, it has good matching property with an Si process. Accordingly, if a photodiode device formed of Ge can be fabricated on an Si substrate, it is possible to overcome the technical barrier in view of the characteristic/process that hinders fusion of optical device/electronic device.

In a case of forming Ge on Si, an epitaxial growing method such as a chemical vapor deposition (CVD) process which has been established technically in the silicon process can be utilized. However, since the Ge has a lattice constant larger by 4% than Si, strain energy is accumulated in a Ge film formed on an Si substrate by epitaxial growing and strain is moderated at or more than film thickness which is called as a critical film thickness, thereby causing crystal defects. While the critical film thickness is different depending on the growing temperature, it is extremely thin in the epitaxial growing as that of a several atom layer at the maximum. Accordingly, a photodiode device that absorbs light sufficiently has to be manufactured at a critical film thickness or more. In a photodiode device where crystal defects are present, a current flows even when optical signals are not present (dark current), which greatly lower the sensitivity of the photodiode device. Accordingly, in a case of manufacturing a Ge photodiode device on an Si substrate, it is extremely important to decrease the crystal defects thereby suppressing the generation of the dark current.

Several methods of suppressing the generation of crystal defects or decreasing the number of defects have been proposed in the epitaxial growing of materials having lattice constant different from that of a substrate as in the growing of Ge on Si.

As a method of epitaxially growing low defect density Ge on Si, the following two methods are effective. As an existent example 1, application of a low temperature buffer layer can be mentioned. This method is described by H-C. Luan, et al. FIG. 3 shows an example of forming Ge on Si by using this related art. According to H-C. Luan, et al., a first Ge layer 102 is epitaxially grown by 30 nm on an Si substrate 101 at a low temperature of 350° C., then second epitaxial growing is conducted while elevating the temperature to 600° C. and a second Ge layer 103 is deposited by about 1 μm. In this case, defects referred to as a threading dislocation passing from the inside to the surface of the film are generated in the Ge film 103 at a high density of about $1 \times 10^9$ cm$^{-3}$. Subsequently, it is possible to decrease the threading dislocation to form a film of low defect density by applying a heat treatment of ascending and descending the temperature between 900° C. and 780° C. by 10 times each fine for 10 min. This method has a mechanism of restoring the crystallinity of the second Ge layer 103 by the heat treatment and moderating strains generated thereby by the first Ge layer 102. That is, by growing the first Ge layer 102 at the low temperature, a number of defects not relevant to covalent bonds such as dangling bonds are formed intentionally to weaken the mechanical strength of crystals. While the heat treatment has a function of restoring the crystallinity in the second Ge layer 103, restoration of the crystallinity increases the strain energy again relative to the underlying Si substrate. In this case, the first Ge layer 102 moderates the strain energy between the Si substrate 101 and the second Ge layer 103 by incorporation of a number of defects 104 further in the layer per se. This method decreases the threading dislocation density to $2 \times 10^7$ cm$^{-3}$.

Another effective means for forming a low defect density Ge layer on an Si substrate is an enriched oxidation process disclosed in JP-A-2005-142217. This method is shown in FIG. 4 as an existent example 2. At first, on an SOI (Silicon On Insulator) substrate in which an Si layer 203 is formed by way of a silicon oxide (SiO$_2$) film 202 on an Si substrate 201, a silicon germanium (SiGe) layer 204 at 15% Ge composition is formed by 40 nm by epitaxial growing, to obtain a structure shown in FIG. 4A. Then, the substrate is oxidized at a temperature of 1000° C. or higher. In this step, only Si is oxidized selectively and Ge is excluded from the oxide film and deposited near the underlying oxide film 202. A state shown in FIG. 4B is formed after the oxidation in which a Ge layer 205 is formed in a state put between the oxide film 202 and an oxide film 206. Ge has 6-nm thickness and contains 1.1% compressive strains.

However, for manufacturing a photodiode device with dark current being decreased sufficiently, it is not sufficient by merely applying the two methods described above as they are and a further improvement is demanded for the method. This is due to the following reasons. For sufficiently decreasing the dark current in the photodiode device, it is necessary that the defect density in the Ge layer is about from $10^5$ to $10^6$ cm$^{-3}$ or less and it is necessary to further decrease the defect density by about one digit to 2 digits than that in the existent example 1 described above. Further, the enriched oxidation process shown in the existent example 2 involves problems in that residual strains are generated as described by S. Nakaharai, et al., and defects (misfit dislocation) are generated upon moderation of the strains caused by substitution of Si with Ge. Means for addressing the problems is in common and means for enhancing the crystallinity of the Ge layer by restrictively forming the Ge layer in both of them has been shown by the existent examples. H-C. Luan, et al. discloses a method of decreasing the defect density further by improving the method shown in the existent example 1. FIG. 5 shows this method as an existent example 3. In this method, after forming an SiO$_2$ film 302 on an Si substrate 301, an opening window 303 is patterned by wet etching or dry etching to obtain a state shown in FIG. 5A. Successively, a low temperature Ge layer 304 and a second Ge layer 305 are epitaxially grown selectively to SiO$_2$ at 350° C. and 600° C. respectively to obtain a state shown in FIG. 5B. Then, by applying the heat treatment described above, the defect density of the second Ge layer 305 can be decreased. According to H-C. Luan, et al., by forming the window 303 as a square of 10 μm side in this method, defect density can be decreased by about one digit compared with that in the existent example 1. Decrease of the defect by this method is based on the mechanism that the second Ge layer 305 extends in a direction parallel to the surface of the substrate upon heat treatment to moderate strains accumulated inside the layer thereby inducing further decrease of the defect density. Therefore, when the size of the window 303 is reduced, the defect density is decreased further. T. Tezuka, et al. shows a method of enhancing the crystallinity of the Ge layer by improving the enriched oxidation process shown in the existent example 2. FIG. 6 shows this method (existent example 4). In the same manner as the existent example 2, after forming an SiGe layer 404 above an SOI substrate by epitaxial growing, the SiGe layer 404 and an Si layer 403 are patterned by wet etching or dry etching to obtain a structure of FIG. 6A. Then, only Si is oxidized selectively at a temperature of 1000° C. or higher to obtain a structure shown in FIG. 6B in which a Ge layer 405 is surrounded by SiO$_2$ films 402 and 406. In this method, the SiGe layer 404 is patterned to provide a room for expanding in a direction parallel to the surface of the substrate and the Ge layer 405 is moderated completely. Further, upon oxidation step, since the SiGe layer 404 expands while sliding on the underlying SiO$_2$ film 402, misfit dislocation generated in the existent example 2 is not caused. According to the existent example 4, a Ge film 405 having a defect density of $1 \times 10^4$ cm$^{-3}$ or less and completely moderated for strains can be obtained by defining the diameter for the SiGe layer 404 to about 2 μm. As described above, according to the existent example, a Ge buffer layer at low defect density can be fabricated on the Si substrate by using the low temperature Ge growing method or the enriched oxidation process and restricting the size of the Ge layer.

However, large area is required for the photodiode device used in optical communication in order to convert the incident light efficiently into an electric current. For example, it is necessary that a surface incident type photodiode device in a high speed optical communication system at 10 GHz in a wavelength region of 1.55 μm has a photodiode portion of 30 μm diameter. Therefore, even when a Ge photodiode device is fabricated on an Si substrate by the existent technique, it was difficult to efficiently convert the incident light into the electric current.

Existent technique for increasing the size in the direction parallel to the surface of the substrate includes an epitaxial lateral growth (ELO) process. As an existent technique of using this method, JP-A-2000-021789 discloses an example of growing gallium nitride (GaN) on a sapphire substrate by ELO. This existent example (existent example 5) is shown in FIG. 7. After depositing an insulating film 502 on a sapphire substrate 501, the insulating film is patterned to form a plurality of windows 503 thereby obtaining the shape as shown in FIG. 7A. Then, a GaN layer 505 is epitaxially grown by way of a buffer layer 504 comprising GaN formed at a low temperature (FIG. 7B). When the GaN layer 505 exceeds the height of the insulating film 502, the GaN layer 505 is grown also in a horizontal direction as well as in the direction perpendicular to the substrate as shown in FIG. 7C. GaN layers 505 grown by ELO from adjacent patterns coalesce to each other on the insulating film and a predetermined region is finally buried by the GaN layer 505 as shown in FIG. 7D. However, since mismatching for the lattice position is caused at the coalesced faces of the two coalesced GaN layers in this method, defects 506 called as stacking defects are generated inevitably in the direction perpendicular to the substrate. Accordingly, this increases the dark current. Degradation of the characteristics is further serious in a case of growing Ge on Si by ELO. T. A. Lango, et al. describe an alternative example of growing Ge on Si by ELO. This existent example is shown in FIG. 8 as an existent example 6. In the same manner as in the existent example 5, an $SiO_2$ film 602 is patterned after deposition on an Si substrate 601 and a Ge layer 603 is epitaxially grown (FIG. 8A). In this process, the plane direction of the Si substrate is (100) used in existent electronic devices. In epitaxial growing of Si type group IV semiconductors, growing rate on a (100) plane is highest compared with other plane directions. Accordingly, in the ELO growth process using the silicon substrate, facet planes 604 having an angle of inclination to the substrate are inevitably formed as shown in FIG. 8B. For example, a (111) plane is formed in a case of ELO process in the [011] direction, and a facet is formed at a (110) plane in a case of ELO process in a [010] direction. Since the facet, plane is stable in view of energy, when Ge layers grown by ELO from adjacent patterns coalesce to each other, a stacking defect 605 extends along the facet plane in the direction oblique to the substrate (FIG. 8C). Therefore, this increases a probability that defects collide against each other and interact to each other. In a case where the defects coalesce to each other, additional stresses are generated in the vicinity of the coalescent portions and defects tend to be generated additionally upon cooling after the growing. Further, stresses are generated during cooling also from facets present on the surface after the growing to form defects. Accordingly, the defect density is higher and the dark current also increases more compared with the case of FIG. 7.

As described above, in the existent technique using ELO growth, it was difficult to form a Ge layer of a large area while keeping good crystallinity. Accordingly, in a case of manufacturing the Ge photodiode device by utilizing the ELO technique, coalescence between each of Ge layers grown from each of the windows by ELO was avoided as disclosed in JP-T-2006-513584 and JP-A-2007-123852. FIG. 9 shows an existent example (existent example 7) of JP-T-2006-513584. After depositing an insulating film 702 and an insulating film 703 above an Si substrate 701, each of the insulating films is patterned as shown in FIG. 9A, and a Ge layer 704 is epitaxially grown. In this case, the Ge layer is grown in two steps by ELO growth and, after completely burying an opening window formed with an insulating film 702 and an insulating film 703, grown above the insulating film 703 in a horizontal direction (FIG. 9A). In this case, since the defects due to strain moderation of Ge are abutted against the side wall of the insulating film 702 and disappear, the defect density of Ge is decreased inside the window formed with the insulating film 703. After scraping off and planarizing the Ge layer above the insulating film 703 by chemical mechanical polishing (CMP), etc., p-type and n-type ion implantation regions 705 and 706 are formed in respective windows as shown in FIG. 9B. Further, after depositing an insulating film 707 further, plug electrodes 708 and upper electrodes 709 are formed to complete a photodiode device (FIG. 9B). In a case of a surface photoreceiving type photodiode device, since it is necessary that the diameter for the entire photodiode device is about 30 μm as described above, a plurality of passive elements are arranged to form a one passive element as shown in FIG. 9B. In this existent example 7, since coalescence of the Ge layers to each other is avoided, the dark current can be decreased compared with the existent example 6 shown in FIG. 7. However, since electrodes are formed in individual Ge regions, it is necessary to ensure a predetermined or more distance between each of the photodiode devices due to the layout rule of the electrodes, and the photoreceiving area cannot be ensured sufficiently. Further, also in individual photodiode devices, since the light is shielded by each of the electrodes and the plugs, actual photoreceiving area is decreased compared with the window formed with the insulating film 503. For the photodiode device used in optical communication, it is required to make the quantum efficiency of converting light into current to 90% or more and it is necessary to absorb light over the substantially entire area of irradiation light. Therefore, the structure shown in FIG. 8B is deteriorated in the characteristics in view of the photoreceiving sensitivity. As a countermeasure for improving the photoreceiving sensitivity, it may be considered a method of increasing the size of individual passive elements but there may be a worry of remarkable increase in the thickness of the grown film and generation of defects in the subsequent steps in this case. For example, assuming the diameter of one photodiode device as 20 μm, even when Ge is grown by ELO in the [010] direction in which the growing rate in the horizontal direction is highest, it is necessary that Ge has to be grown by at least 10 μm or more in the direction perpendicular to the substrate in order to bury the window inside the insulating film 503, which remarkably increases the growing time and may deteriorate the selectivity to the insulating film to deposit polycrystal Ge on the insulating film 503. Further, since this requires scraping out most of the pyramidal Ge layer of 10 μm thickness by CMP, the potential of generating defects by the stress generated during polishing is also high. In view of the above, for attaining a Ge photodiode device at high efficiency and with less dark current, it is necessary to establish a manufacturing process of forming a Ge region of low defect density, allowing Ge grown from individual regions to coalesce by ELO to each other, and not generating defects upon coalescence, as well as a structure of a photodiode device for attaining the process described above.

The present invention has been achieved in view of the foregoing problems and it intends to establish a method of forming Ge of large area and low defect density above an Si substrate and provide a Ge photodiode device having high photoreceiving sensitivity and low dark current characteristic, as well as a manufacturing method thereof.

A typical example of the inventions is to be shown as below.

That is, a semiconductor photodiode device according to an aspect of the invention includes a semiconductor substrate; a first buffer layer formed above the semiconductor substrate and containing a material different from that of the semiconductor substrate in a portion thereof; a first semiconductor layer formed above the buffer layer and having a lattice constant different from that of the semiconductor substrate; a second buffer layer formed above the first semiconductor layer and containing an element identical with that of the first semiconductor layer in a portion thereof; and a second semiconductor layer formed above the buffer layer, in which a portion of the first semiconductor layer is formed of a plurality of island shape portions each surrounded with an insulating film, and the second buffer layer allows adjacent islands of the first semiconductor layer to coalesce with each other and is in contact with the insulating film.

Further, a method of manufacturing a semiconductor photodiode device according to an aspect of the invention includes the steps of: forming an opening window with an insulating film above a semiconductor substrate; epitaxially growing a first buffer layer containing a material different from that of the semiconductor substrate in a portion thereof and a first semiconductor layer having a lattice constant different from that of the semiconductor substrate continuously in the window selectively and decreasing a crystal defect density in the first semiconductor layer by a heat treatment; crystallographically growing the first semiconductor layer in a direction parallel to the surface of the semiconductor substrate thereby forming a plurality of island shape first semiconductor regions; forming a second buffer layer of a first conduction type containing an element identical with that of the first semiconductor layer in a portion thereof by epitaxial growing and allowing adjacent islands comprising the first semiconductor region to coalesce with each other; and forming a first conduction type second semiconductor layer by epitaxial growing above the second buffer layer and decreasing a crystal defect density in the second semiconductor layer by a heat treatment.

According to an aspect of the invention, it is possible to provide a germanium photodiode device capable of forming germanium at a low defect density with good crystallinity above a silicon substrate and capable of decreasing a dark current, as well as a manufacturing method thereof.

DETAILED DESCRIPTION OF THE PREFERRED EMBODIMENTS

Figure 1:
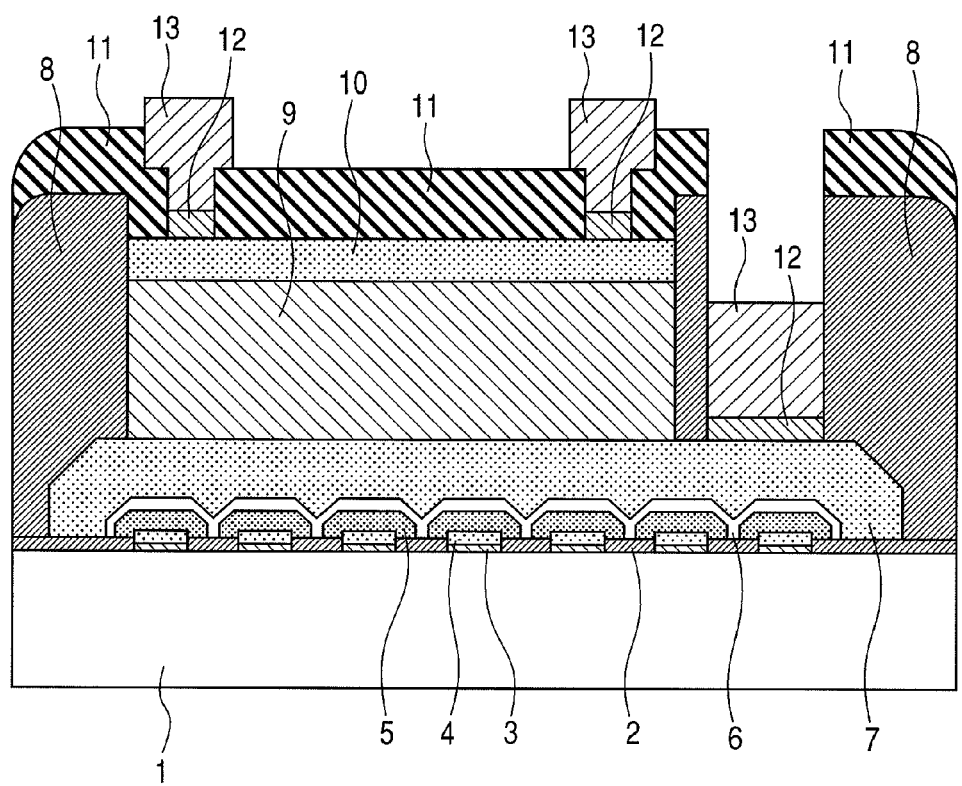
FIG. 1 is a cross sectional view showing a first embodiment of a semiconductor photodiode device according to the present invention.
Figure 2:
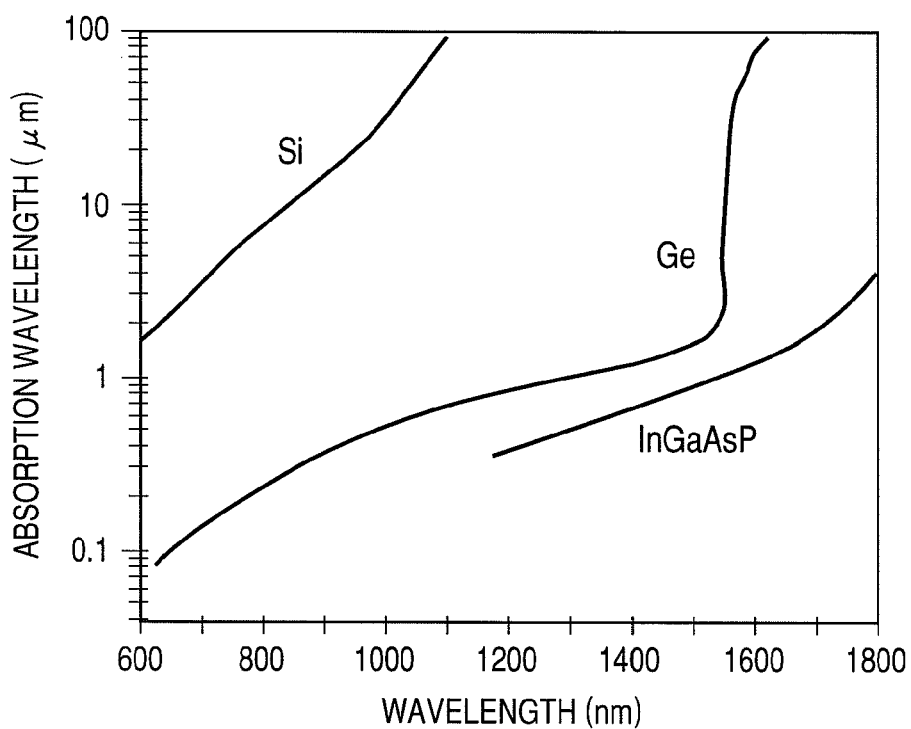
FIG. 2 is a graph showing light absorbing characteristics of various kinds of semiconductor materials.
Figure 3:
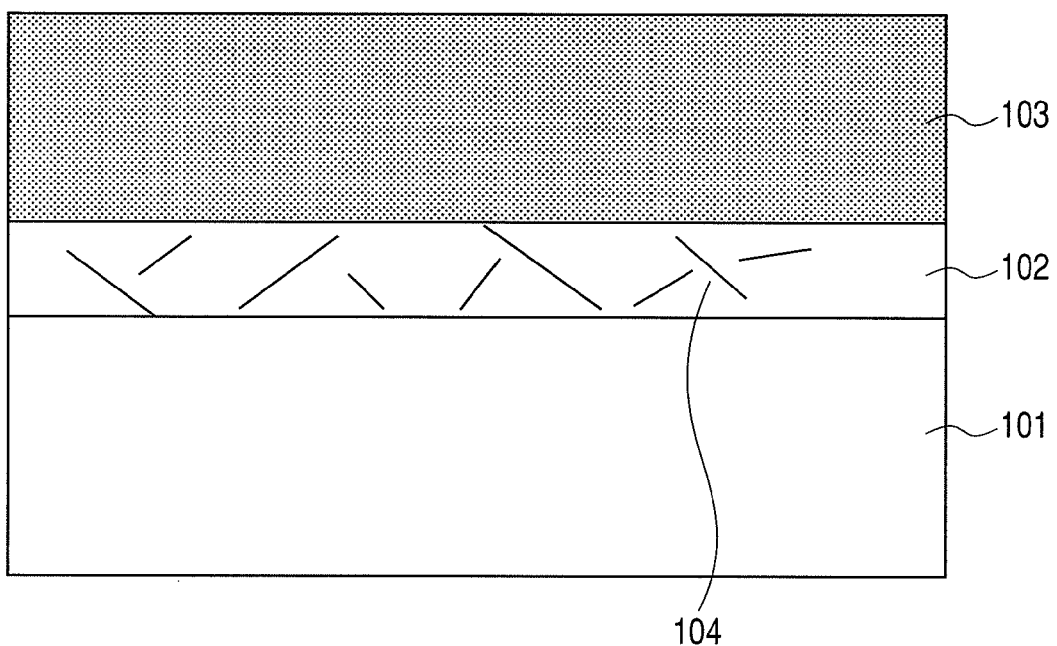
FIG. 3 is a cross sectional view showing a technique of forming a low defect layer of an existent example 1.
Figure 4A:
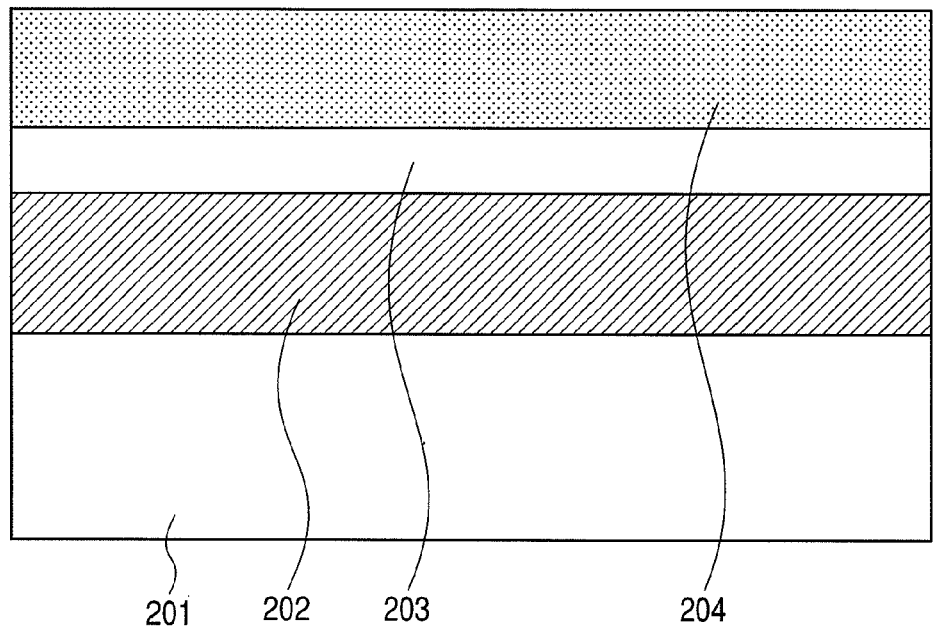
FIG. 4A is a cross sectional view showing a technique of forming a low defect layer of an existent example 2.
Figure 4B:
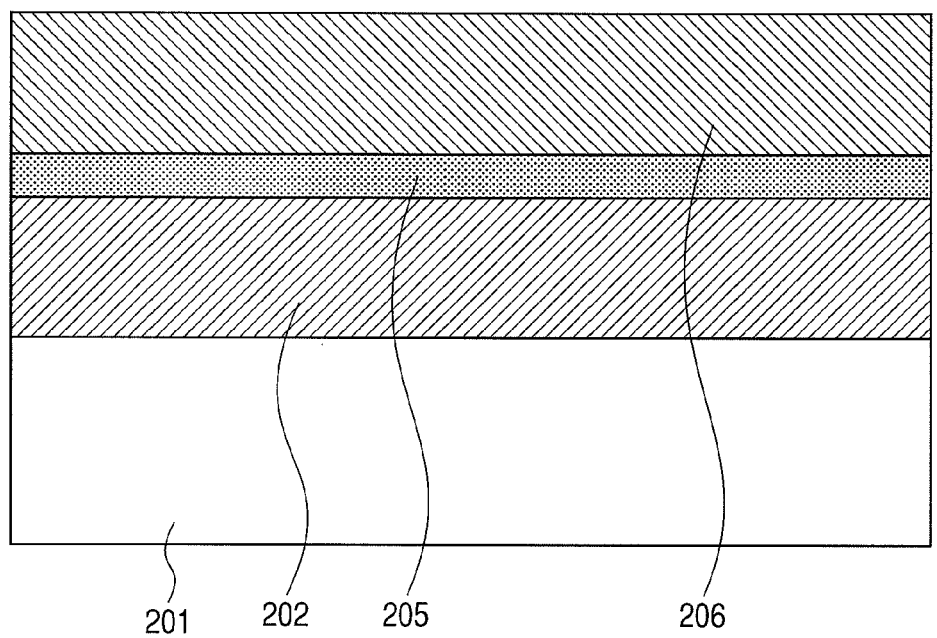
FIG. 4B is a cross sectional view showing a technique of forming a low defect layer of the existent example 2.
Figure 5A:
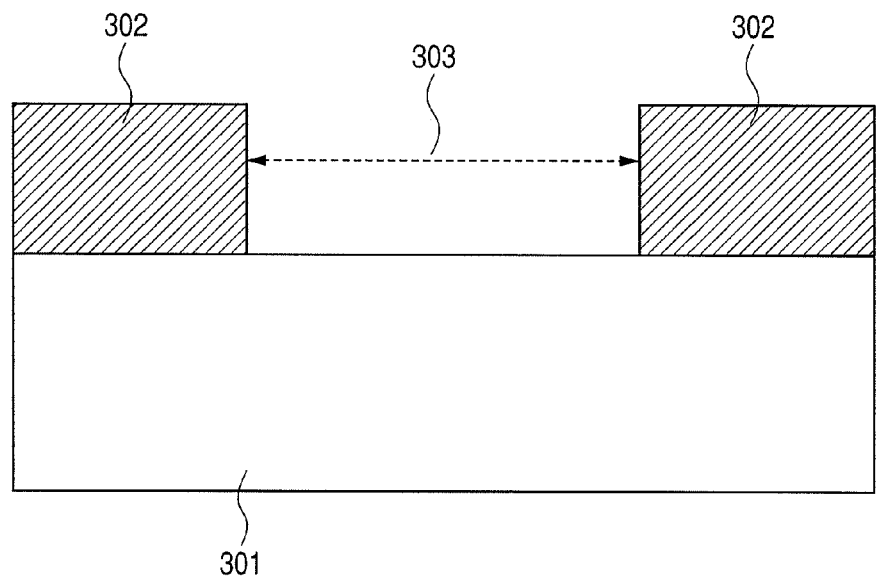
FIG. 5A is a cross sectional view showing a technique of forming a low defect layer of an existent example 3.
Figure 5B:
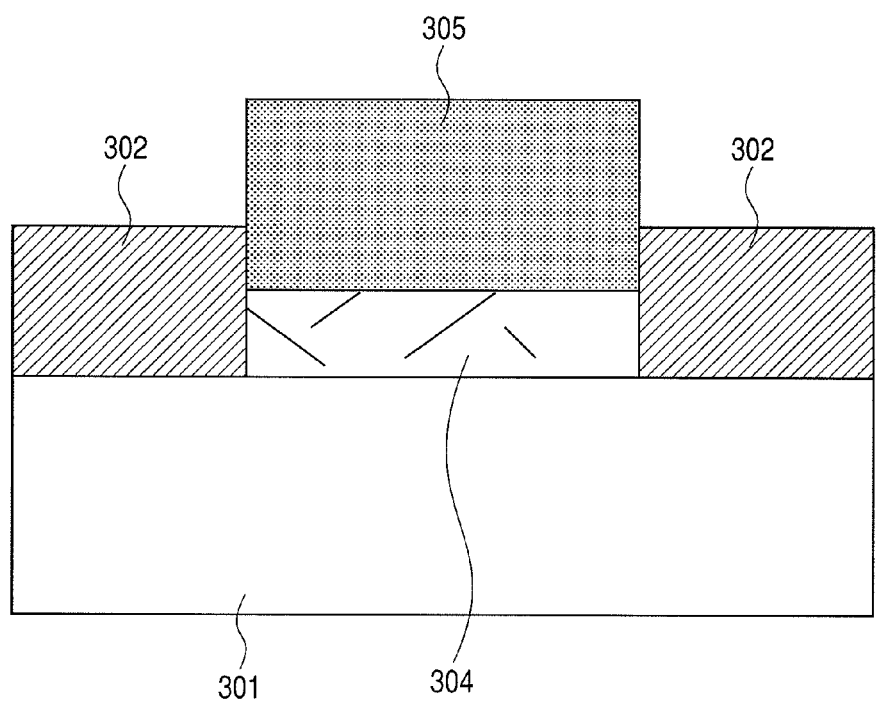
FIG. 5B is a cross sectional view showing a technique of forming a low defect layer of the existent example 3.
Figure 6A:
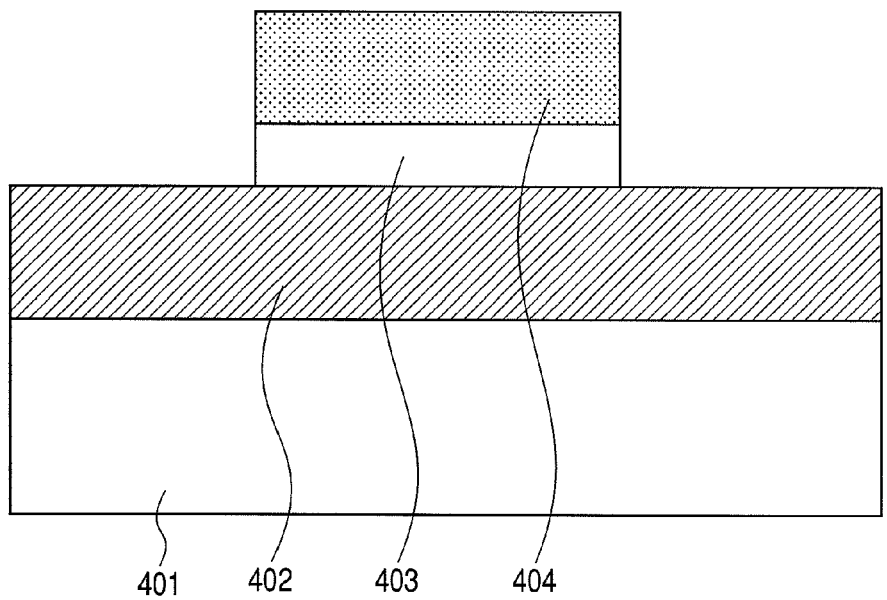
FIG. 6A is a cross sectional view showing a technique of forming a low defect layer of an existent example 4.
Figure 6B:
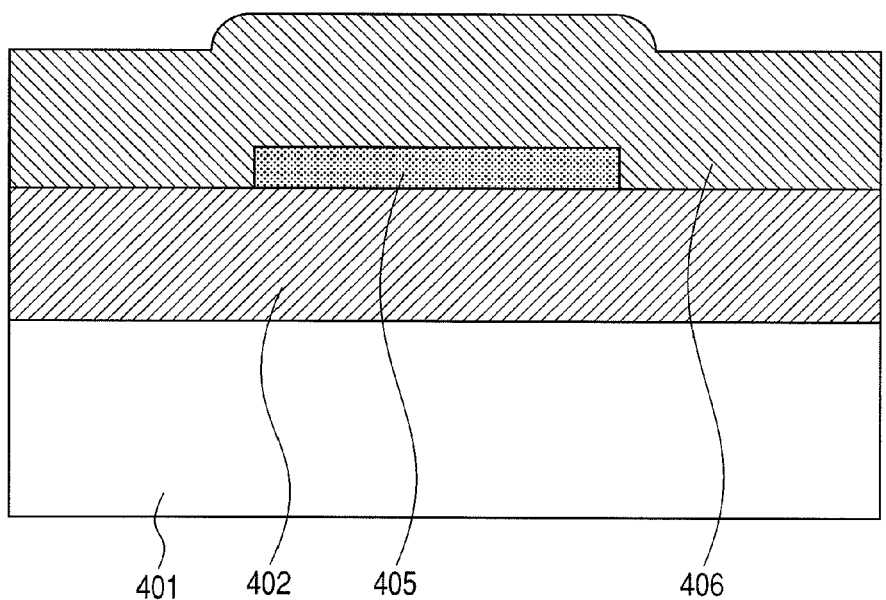
FIG. 6B is a cross sectional view showing a technique of forming a low defect layer of the existent example 4.
Figure 7A:
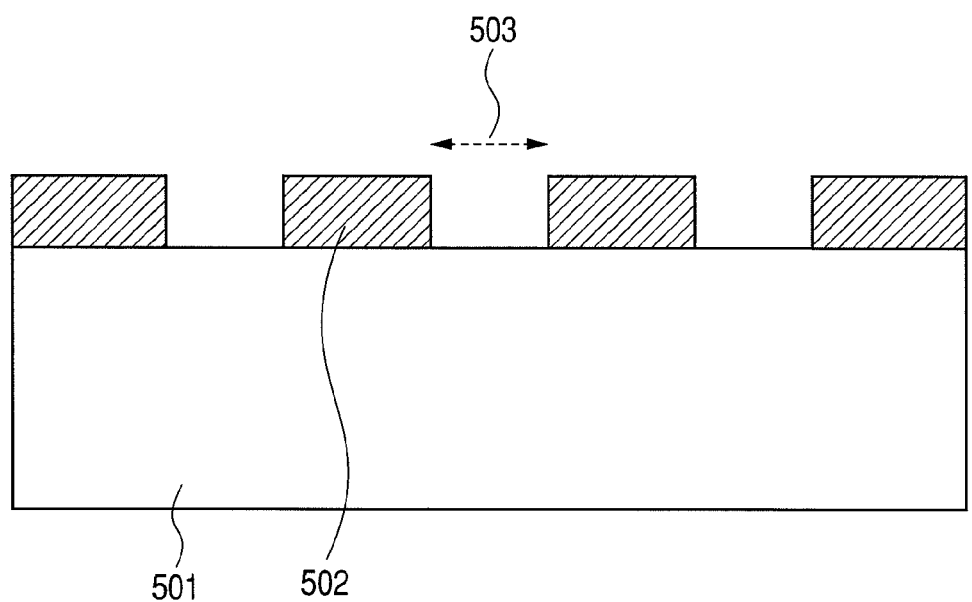
FIG. 7A is a cross sectional view showing a technique of forming a low defect layer of an existent example 5.
Figure 7B:
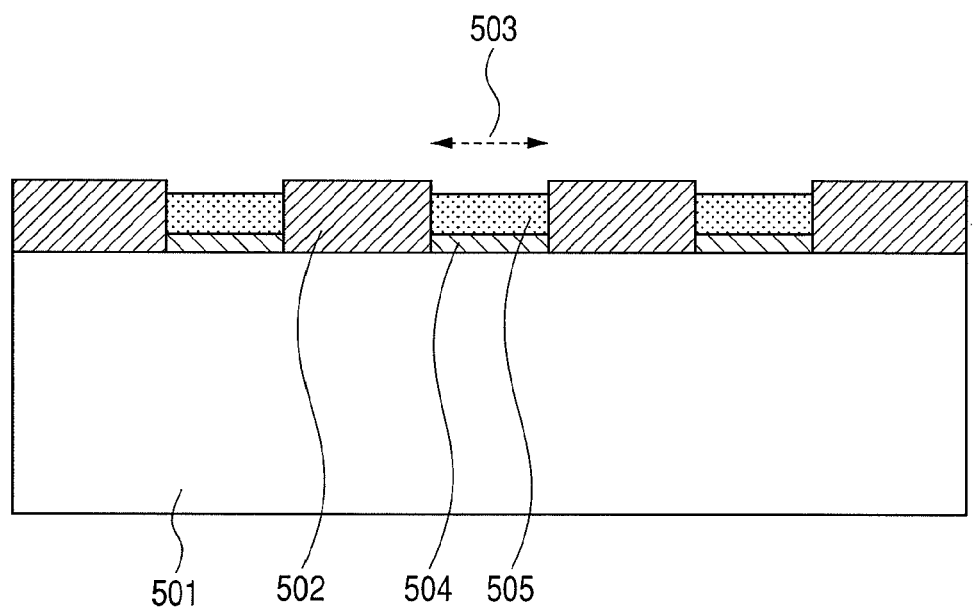
FIG. 7B is a cross sectional view showing a technique of forming a low defect layer of the existent example 5.
Figure 7C:
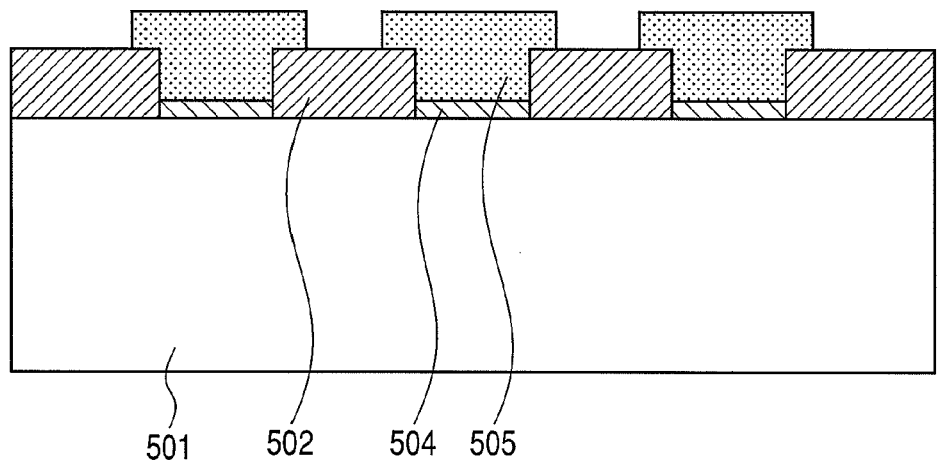
FIG. 7C is a cross sectional view showing a technique of forming a low defect layer of the existent example 5.
Figure 7D:
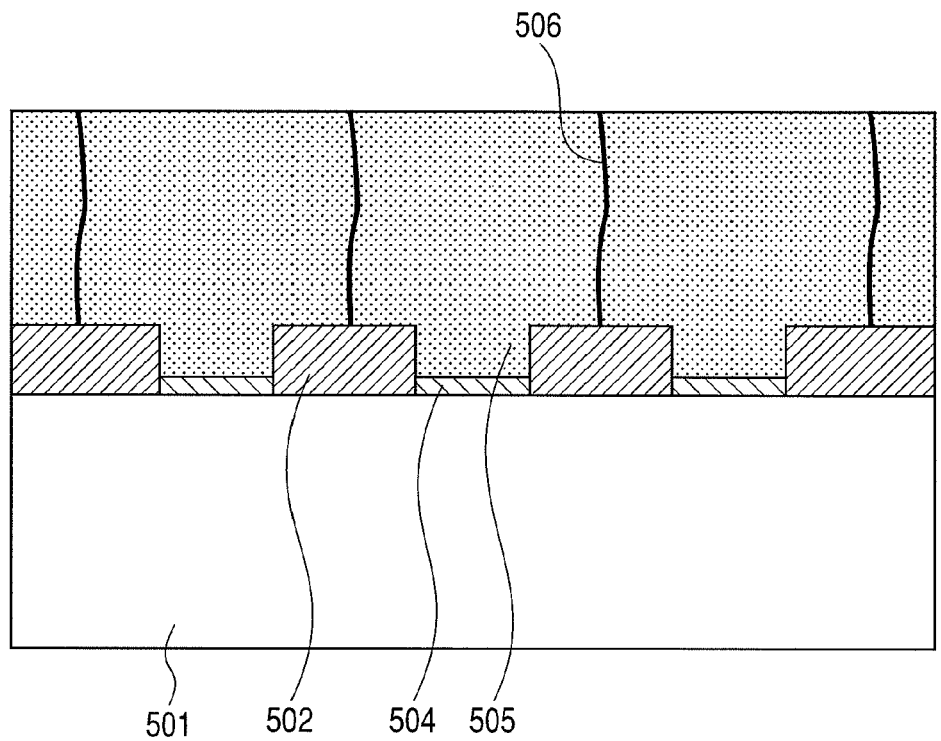
FIG. 7D is a cross sectional view showing a technique of forming a low defect layer of the existent example 5.
Figure 8A:
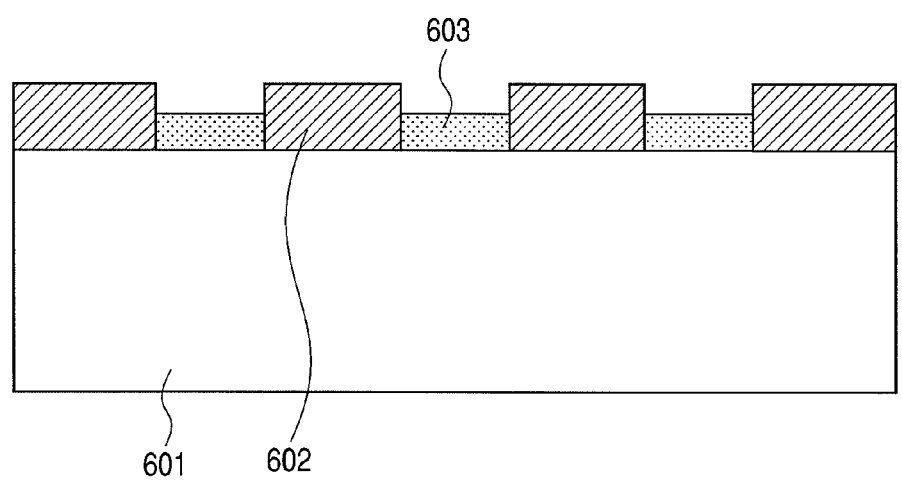
FIG. 8A is a cross sectional view showing a technique of forming a low defect layer of an existent example 6.
Figure 8B:
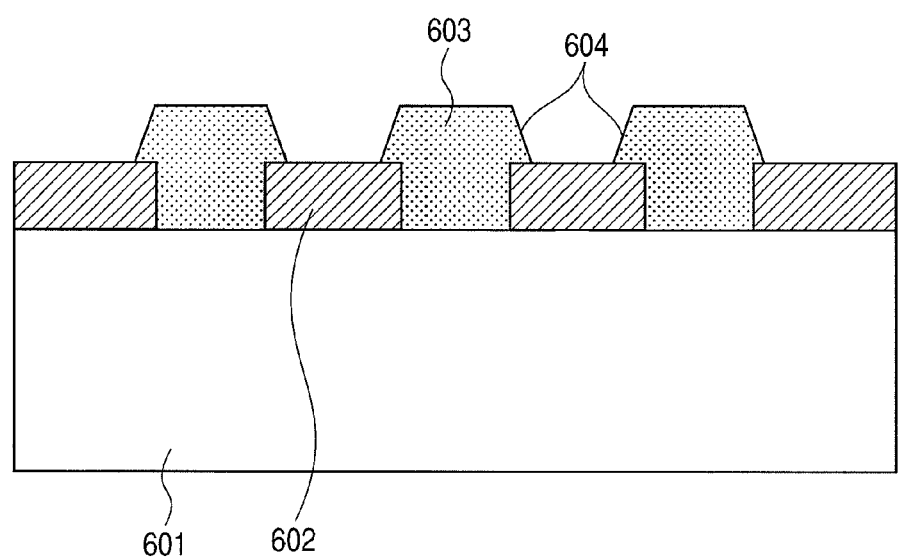
FIG. 8B is a cross sectional view showing a technique of forming a low defect layer of the existent example 6.
Figure 8C:
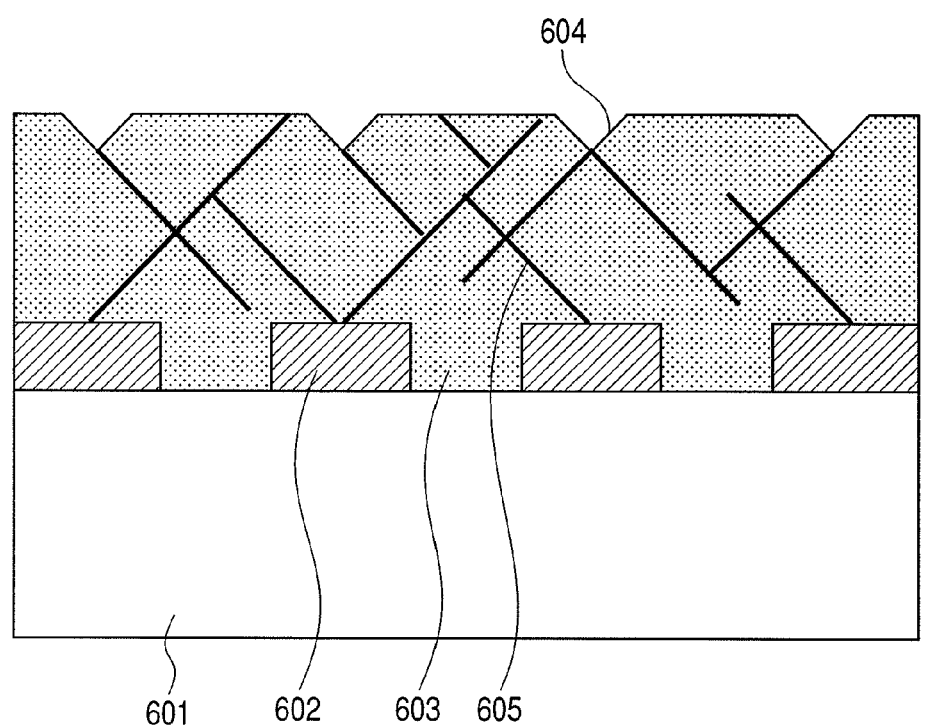
FIG. 8C is a cross sectional view showing a technique of forming a low defect layer of the existent example 6.
Figure 9A:
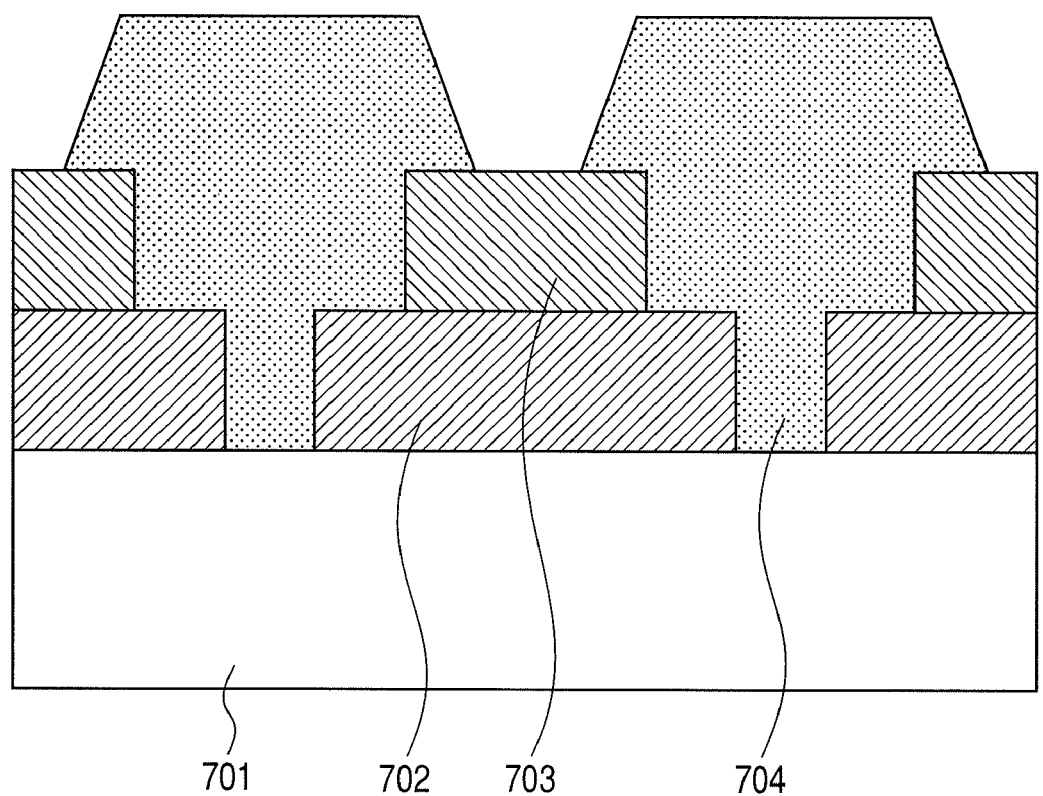
FIG. 9A is a cross sectional view showing a technique of forming a low defect layer of an existent example 7.
Figure 9B:
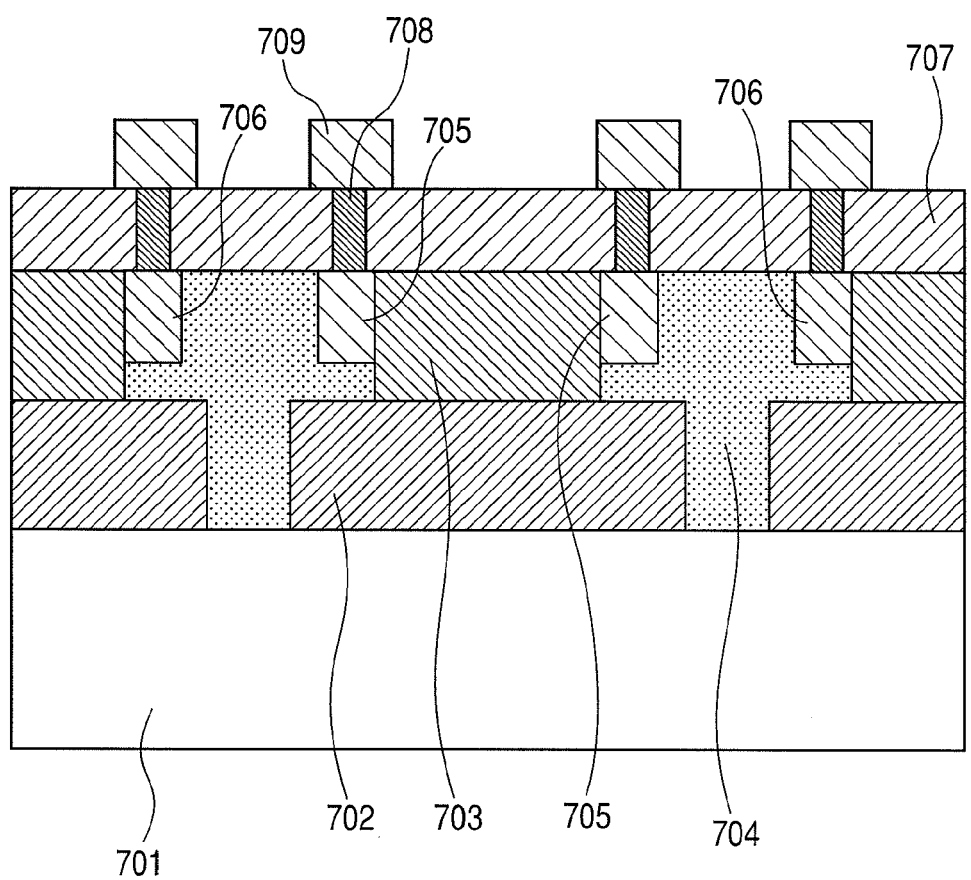
FIG. 9B is a cross sectional view showing a technique of forming a low defect layer of the existent example 7.

The present invention for addressing the problems described above has the following features.

A semiconductor photodiode device according to an exemplary embodiment of the invention includes: a semiconductor substrate; a first buffer layer formed above the semiconductor substrate and containing a material different from that of the semiconductor substrate in a portion thereof; a first semiconductor layer formed above the buffer layer and having a lattice constant different from that of the semiconductor substrate; a second buffer layer formed above the first semiconductor layer and containing an element identical with that of the first semiconductor layer in a portion thereof; and a second semiconductor layer formed above the buffer layer, in which a portion of the first semiconductor layer is formed of a plurality of island shape portions each surrounded with an insulating film, and the second buffer layer allows adjacent islands of the first semiconductor layer to coalesce with each other and is in contact with the insulating film.

It is preferred in this embodiment that the first semiconductor layer comprises a first portion in contact with the first buffer layer and a second portion situated by way of the first portion on the side opposite to the semiconductor substrate, the first portion is surrounded at the lateral side thereof with the insulative film and the second portion, and the second portion is in contact with the surface of the insulating film on the side opposite to the semiconductor substrate.

Further, it is preferred that the semiconductor photodiode device that the second portion of the first semiconductor layer, the second buffer layer, and the second semiconductor layer have a first conduction type, a third semiconductor layer high resistance containing an element identical with that of the second semiconductor layer is present above the second semiconductor layer, and a second conduction type fourth semiconductor layer containing an element identical with that of the second semiconductor is present above the third semiconductor layer.

Alternatively, a portion of the second buffer layer and a portion of the second semiconductor layer may have a first conduction type in the vicinity of a portion of the second buffer layer in contact with the insulating film, and a portion of the first semiconductor layer, a portion of the second buffer layer, and a portion of the second semiconductor layer may have a second conduction type from the vicinity for the center of the island of the first semiconductor layer to a region thereabove.

It is preferred in the semiconductor photodiode device that the semiconductor substrate comprises silicon, the first semiconductor layer and the second semiconductor layer comprise each single crystal germanium or single crystal silicon-germanium, the second buffer layer is formed at a low temperature and comprises germanium or silicon-germanium containing defects in the inside.

It is further preferred that the first buffer layer is a semiconductor layer formed at a low temperature in an opening window formed with the insulating film and containing defects in the inside and the constituent element is silicon, silicon-germanium, or germanium.

Alternatively, it is also preferred that the first buffer layer is present between the semiconductor substrate and the insulating film and comprises silicon dioxide.

A method of manufacturing a semiconductor photodiode device according to an exemplary embodiment of the invention includes the steps of: forming an opening window with an insulating film above a semiconductor substrate; epitaxially growing a first buffer layer containing a material different from that of the semiconductor substrate in a portion thereof and a first semiconductor layer having a lattice constant different from that of the semiconductor substrate continuously in the window selectively and decreasing a crystal defect density in the first semiconductor layer by a heat treatment; crystallographically growing the first semiconductor layer in a direction parallel to the surface of the semiconductor substrate thereby forming a plurality of island shape first semiconductor regions; forming a first conduction type second buffer layer containing an element identical with that of the first semiconductor layer in a portion thereof by epitaxial growing and allowing adjacent islands each comprising the first semiconductor region to coalesce with each other; and forming a first conduction type second semiconductor layer by epitaxial growing above the second buffer layer and decreasing a crystal defect density in the second semiconductor layer by a heat treatment.

Alternatively, a method of manufacturing a semiconductor photodiode device preferably includes the steps of forming, above an imaginary substrate having a second insulative film and a third semiconductor layer formed above a semiconductor substrate, a fourth semiconductor layer having a lattice constant different from that of the semiconductor substrate by epitaxial growing; selectively oxidizing only the element identical with the element constituting the semiconductor substrate present in the third semiconductor layer and the fourth semiconductor layer to obtain a fifth semiconductor layer; crystallographically growing the fifth semiconductor layer in a direction parallel to the surface of the semiconductor substrate thereby forming a plurality of island shape second semiconductor regions; forming a first conduction type third buffer layer containing an element identical with that of the fifth semiconductor layer in a portion thereof by epitaxial growing and allowing adjacent islands each comprising the second semiconductor region to coalesce with each other; and forming a first conduction type sixth semiconductor layer by epitaxial growing above the third buffer layer and decreasing a crystal defect density in the sixth semiconductor layer by a heat treatment.

Further, it is preferred that the method of manufacturing the semiconductor photodiode device includes the steps of: epitaxially growing a seventh semiconductor layer of high resistance and containing an element identical with that of the second or the sixth semiconductor layer above the second or the sixth semiconductor layer; and epitaxially growing an eighth semiconductor layer of a second conduction type and containing an element identical with that of the second or the sixth semiconductor layer above the seventh semiconductor layer.

Alternatively, the manufacturing method may preferably include further the steps of: implanting ions so as to make a portion of the second or the third buffer layer and a portion of the second or the sixth semiconductor layer to a first conduction type in the vicinity of a region where the second or the third buffer layer allows the first or the second island shape semiconductor regions to coalesce with each other; and implanting ions so as to make a portion of the first or the fifth semiconductor layer, a portion of the second or the third buffer layer, and a portion of the second or the sixth semiconductor layer to a second conduction type from the vicinity for the central portion of the island of the first or the fifth semiconductor layer to a region thereabove.

According to the semiconductor photodiode device and the manufacturing method thereof of the invention, it is possible to enhance the crystallinity of germanium by forming germanium in an island shape above silicon, and confine defects generated by coalescence of the adjacent islands inside the buffer layer by further conducting epitaxial lateral growth from individual island and inserting the buffer layer only in the vicinity of the coalesced portion between each of the islands. This can provide a germanium photodiode device and a manufacturing method thereof capable of forming low defect density germanium with good crystallinity above the silicon substrate and decreasing the dark current.

Preferred embodiments of the invention are to be described specifically with reference to the drawings. Throughout the drawings for explaining the embodiments, those members having identical functions carry same reference numerals for which duplicate descriptions are to be omitted. It will be apparent that various modifications are possible such as alteration of materials and combination of manufacturing steps in addition to the method disclosed in this embodiment.

Specific embodiments are to be described below. Figures described in the drawings are not always conformed to exact size reduction but they are schematically shown while emphasizing important portions so as to make the explanation clearer.

First Embodiment

In this embodiment, a low defect density Ge photodiode device formed above a silicon substrate with Ge island using a low temperature germanium buffer layer being as a nuclei, as well as a manufacturing method thereof.

FIG. 1 is a cross sectional structural view showing a first embodiment of a semiconductor photodiode device according to the invention. This cross sectional structure shows a structure of a photodiode portion in a bipolar phototransistor having a photodiode portion and an amplification portion separately.

Reference numeral 1 in FIG. 1 denotes a silicon (Si) substrate. Above the Si substrate 1, a patterned insulating film 2, a Ge buffer layer 3 grown at a low temperature and a Ge layer 4 are formed by selective epitaxial growing in an opening window opened in the insulating film 2. On the Ge layer 4, a Ge layer 5 is grown in the perpendicular direction and the horizontal direction to the substrate by epitaxial lateral growth so as to cover the Ge layer 4. A slight spacing is present between each of the island shape Ge layers 5, and a low temperature grown Ge buffer layer 6 buries the spacing. Further, a high concentration n-type Ge layer 7 is selectively grown over the entire surface so as to cover the entire islands to form an n-type electrode layer for the Ge photodiode device. In the n-type electrode layer, a heat treatment is applied after epitaxial growing of the Ge buffer layer 3 and the Ge layer 4 by which the crystallinity of the Ge layer 4 is restored. One of the features of this embodiment is to enlarge the size by utilizing the low defect Ge layer 4 and by epitaxial lateral growth. As to be described later, the crystal defect density present in the Ge layer 4 is decreased together with the size reduction of the Ge layer 4. In this embodiment, the size of the Ge layer 4 is defined to about 2 μm. The crystal defect density in this case is about $1 \times 10^5$ cm$^{-2}$. The second feature of this embodiment is that the Ge buffer layer 6 buries the spacing between each of the adjacent islands formed by the Ge layer 4. This can confine the defects generated by the coalescence between each of the islands of the Ge layer 4 inside the Ge buffer layer 6 as to be described later. Further, by applying the heat treatment after forming the high concentration n-type Ge layer 7, the density of defects remaining in the high concentration n-type Ge layer 7 is further decreased. According to this method, the defect density of the n-type Ge layer 7 is decreased to one-half or less of that in the Ge layer 4. Further, n-type doping is applied to the Ge buffer layer 6, so that electron-hole pairs if generated by the defects in the buffer layer 6 have no concerns with the dark current.

Above the high concentration n-type Ge layer 7, an insulating film 8 is patterned and a photodiode device forming region is opened. It is structured such that a light absorption layer comprising a high resistance Ge layer 9 and a high concentration p-type Ge layer 10 are formed by selective epitaxial growing in the window, and metal electrodes 12, 13 are formed above the p-type Ge layer 10 and the n-type Ge layer 7. Further, in this photodiode device, a silicon nitride (Si$_3$N$_4$) film 11 is deposited by about 800 nm above the p-type Ge layer 10 and patterned above the photodiode portion. The Si$_3$N$_4$ film has an effect of applying a two dimensional tensile stress to the Ge layer of the photodiode device. It is generally known that the band gap of the Ge layer undergoing the tensile stress is decreased, and the absorption efficiency to a light at a long wavelength is increased by the deposition of Si$_3$N$_4$.

The Ge photodiode device disclosed in this embodiment has a feature in the coalescence of low defect density Ge island regions without generating defects, in which a Ge layer 7 with low defect density and large area is formed as the n-type electrode layer of the photodiode device. Accordingly, a Ge photodiode device of low dark current and high sensitivity can be attained.

Then, a specific manufacturing method of a semiconductor device in this embodiment is to be described specifically with reference to FIG. 10A to FIG. 10L.

Figure 10A:
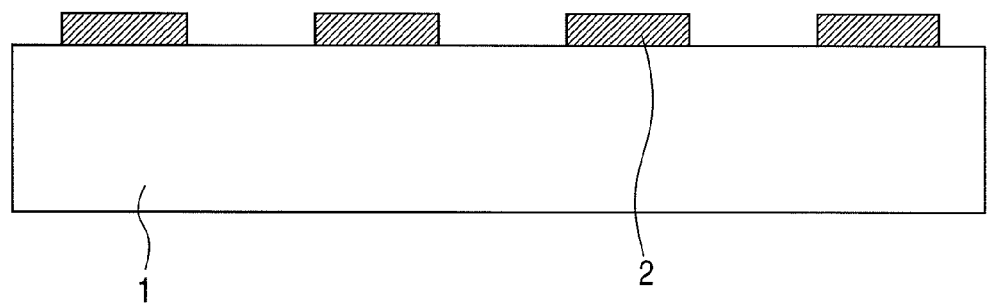
FIG. 10A is a cross sectional view showing a method of manufacturing a semiconductor photodiode device in a first embodiment, successively.

An insulating film 2 is deposited above an Si substrate 1 and an opening window is formed by wet etching or dry etching to obtain a structure shown in FIG. 10A. The insulating film is made, for example, of a silicon oxide film (SiO$_2$), and hydrofluoric acid (HF) diluted to 0.5% may be used for wet etching. In the case of dry etching, fabrication is conducted by using an etching gas containing a fluoro compound.

Figure 11A:
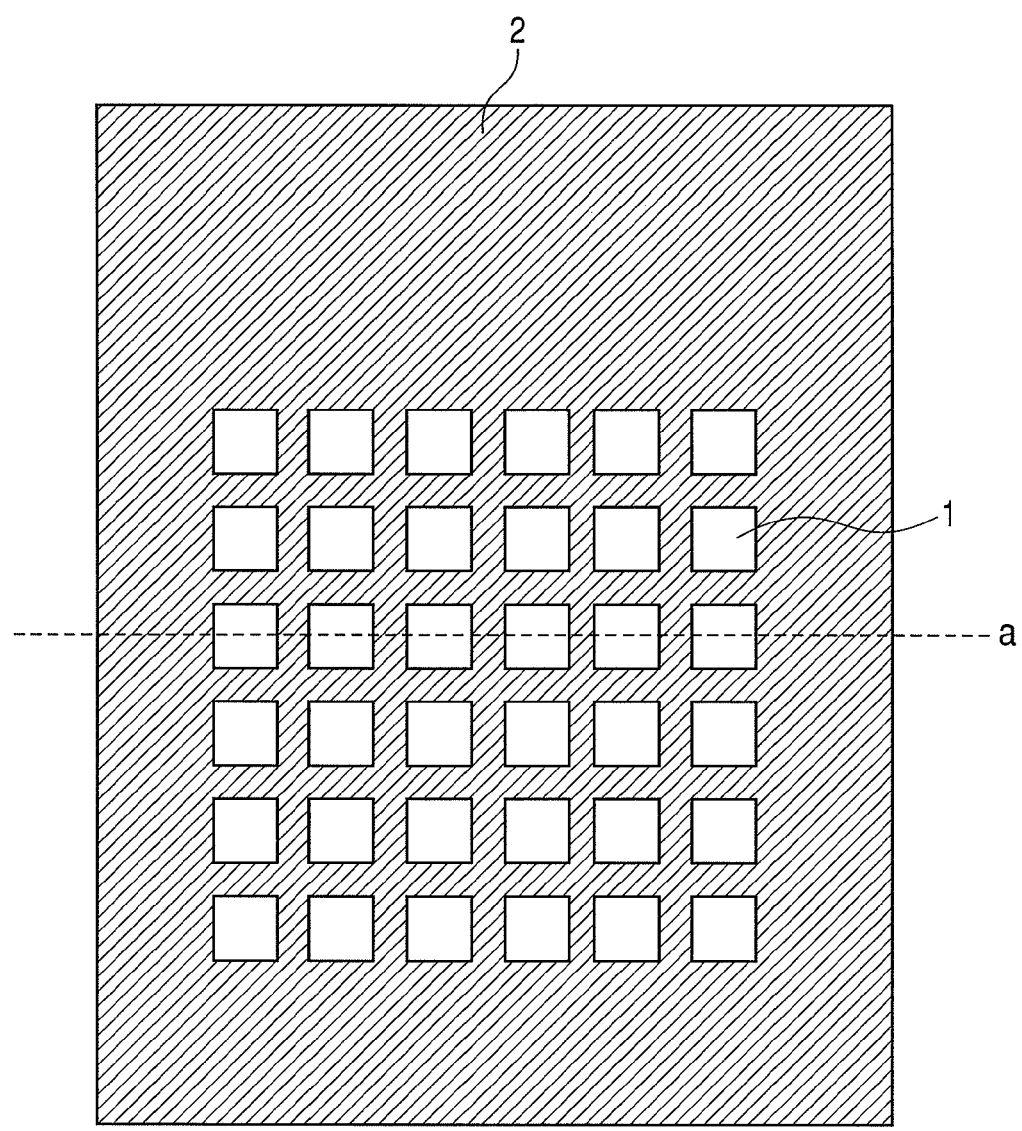
FIG. 11A is a plan view showing a method of manufacturing a semiconductor photodiode device in the first embodiment successively.

The surface structure after patterning is shown in FIG. 11A. The window surrounded by the insulating film 2 is formed as a pattern where square patterns are arranged in the lattice shape. The size and the spacing of the window are decided while considering the Ge growing rate, etc. as to be described later. Further, also the direction of the pattern is decided while considering the epitaxial lateral growing of Ge islands.

Figure 10B:
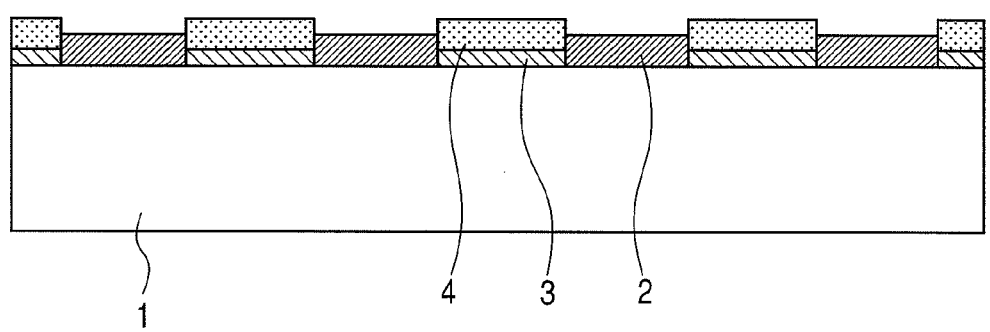
FIG. 10B is a cross sectional view showing a method of manufacturing the semiconductor photodiode device in the first embodiment, successively.

A buffer layer 3 and an n-type Ge layer 4 are formed successively by epitaxial growing using a gas source molecular beam epitaxy (MBE) method, a chemical vapor deposition (CVD) method, etc. to obtain a structure shown in FIG. 10B. The buffer layer 3 is formed by epitaxially growing Si, silicon-germanium (SiGe), or Ge by about 30 nm at a low temperature of about 350° C. Monosilane ($SiH_4$) or disilane ($Si_2H_6$) is used as a starting gas for Si and monogerman ($GeH_4$) is used as a starting gas for Ge. In this process, a number of dangling bonds having no concerns with covalent bonds are generated in the low temperature grown buffer layer 3 and the crystal intensity of the buffer layer 3 is weak. Then, the n-type Ge layer 4 is epitaxially grown by 50 to 200 nm at a growing temperature of 550° C. to 650° C. this process, epitaxial growing for the buffer layer 3 and the n-type Ge layer 4 are carried out under the conditions of selectively growing them only above the Si substrate 1 to the oxide film. In the case of growing Ge, this can be grown selectively by about 3 μm or more within a wide pressure range of from 1 Pa to 1000 Pa within the range of the temperature described above. In the n-type Ge layer 4 after growing, number of defects are present which are generated upon moderating the strain energy due to the difference of the lattice constant between Si and Ge. Accordingly, a heat treatment is applied after growing. In the heat treatment, it is effective to ascend and descend the temperature between 900° C. and 780° C. for 10 times each time for 10 min. In this case, defects present in the n-type Ge layer 4 are repaired and the crystallinity is restored. Upon recovery of the crystallinity, while large strain energy is generated, the strain energy can be moderated by generating defects selectively only in the underlying buffer layer 3 and the n-type Ge layer 4 of good crystallinity can be obtained. Further it has been found that the size of the Ge layer 4 concerns the moderation of the strain energy. This is attributable to that the Ge layer 4 can expand volumetrically by limiting the size of the Ge layer 4 and the strain energy can be moderated effectively. Due to the effect of the mechanism described above, the defect density in the Ge layer 4 tends to be decreased along with size reduction of the Ge layer 4. For example, if the size of the Ge layer 4 is defined to 2 μm, the crystal defect density can be decreased to about $1 \times 10^5$ $cm^{-2}$.

Figure 10C:
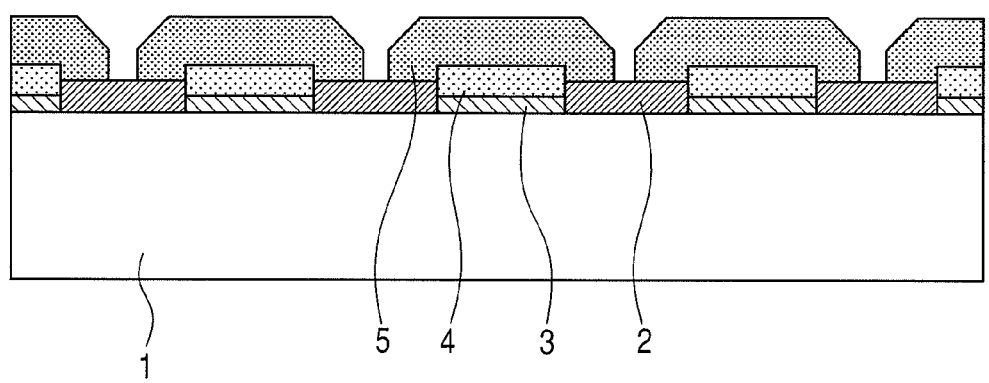
FIG. 10C is a cross sectional view showing a method of manufacturing a semiconductor photodiode device in the first embodiment, successively.
Figure 10D:
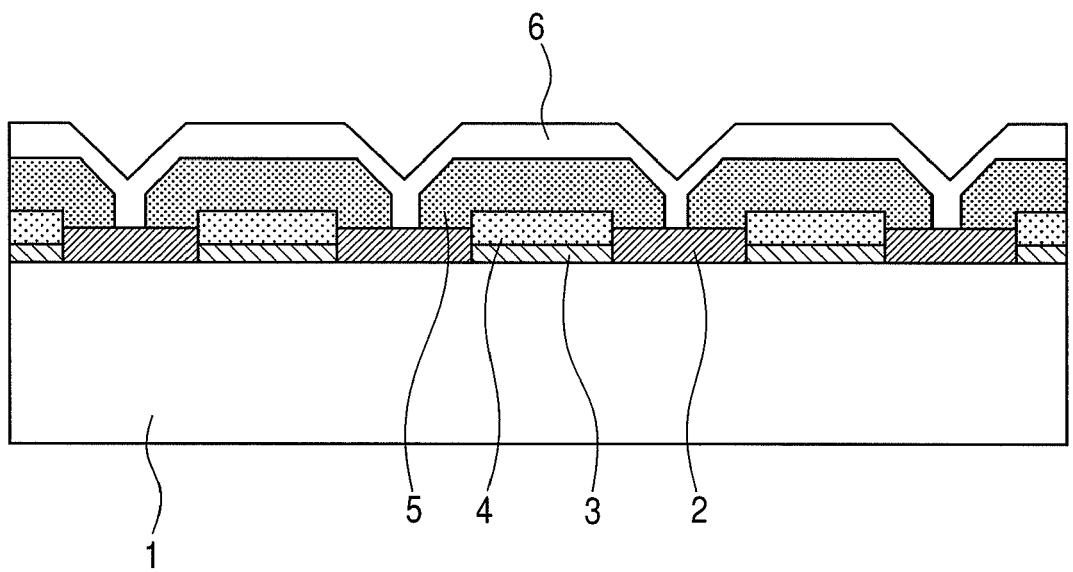
FIG. 10D is a cross sectional view showing a method of manufacturing a semiconductor photodiode device in the first embodiment, successively.

Then, an n-type Ge layer 5 is formed by selective epitaxial growing. In this process, the Ge layer 5 is grown by epitaxial lateral growth (ELO), where it is grown both in the perpendicular direction and the horizontal direction to the Si substrate 1 and formed so as to cover the portion above the Ge layer 4 as shown in FIG. 10C. For promoting epitaxial lateral growth, the direction of patterning the insulating film 2 is preferably defined as <100>. In this case, the growing rate in the vertical direction and the growing rate in the lateral direction to the (001) plane of the substrate are equal to each other. However, along with growing, a facet plane comprising a (100) plane is formed, and the (100) plane on the lateral wall of the Ge layer 5 vertical to the substrate finally disappears. When the (100) plane disappears, since defects generated upon coalescence of Ge islands to each other are generated along the (101) plane, this increases the defect density. Accordingly, it is necessary to keep the (100) plane of the side wall until just before the coalescence of adjacent islands in the Ge layer 5. Then, it is necessary to control the spacing between the islands in accordance with the growing rate in the direction horizontal to the substrate and the size of the Ge island. Assuming the size of the Ge island 5 as 2 μm, it is preferred that the spacing between the islands is about 2 μm or less. As the patterning direction of the insulating film 2, <110> plane may also be used. However, since the epitaxial lateral growing rate in the <110> direction is extremely low, it is necessary to decrease the pattern spacing. In this invention, the spacing is preferably defined as about 0.5 μm.

Figure 11B:
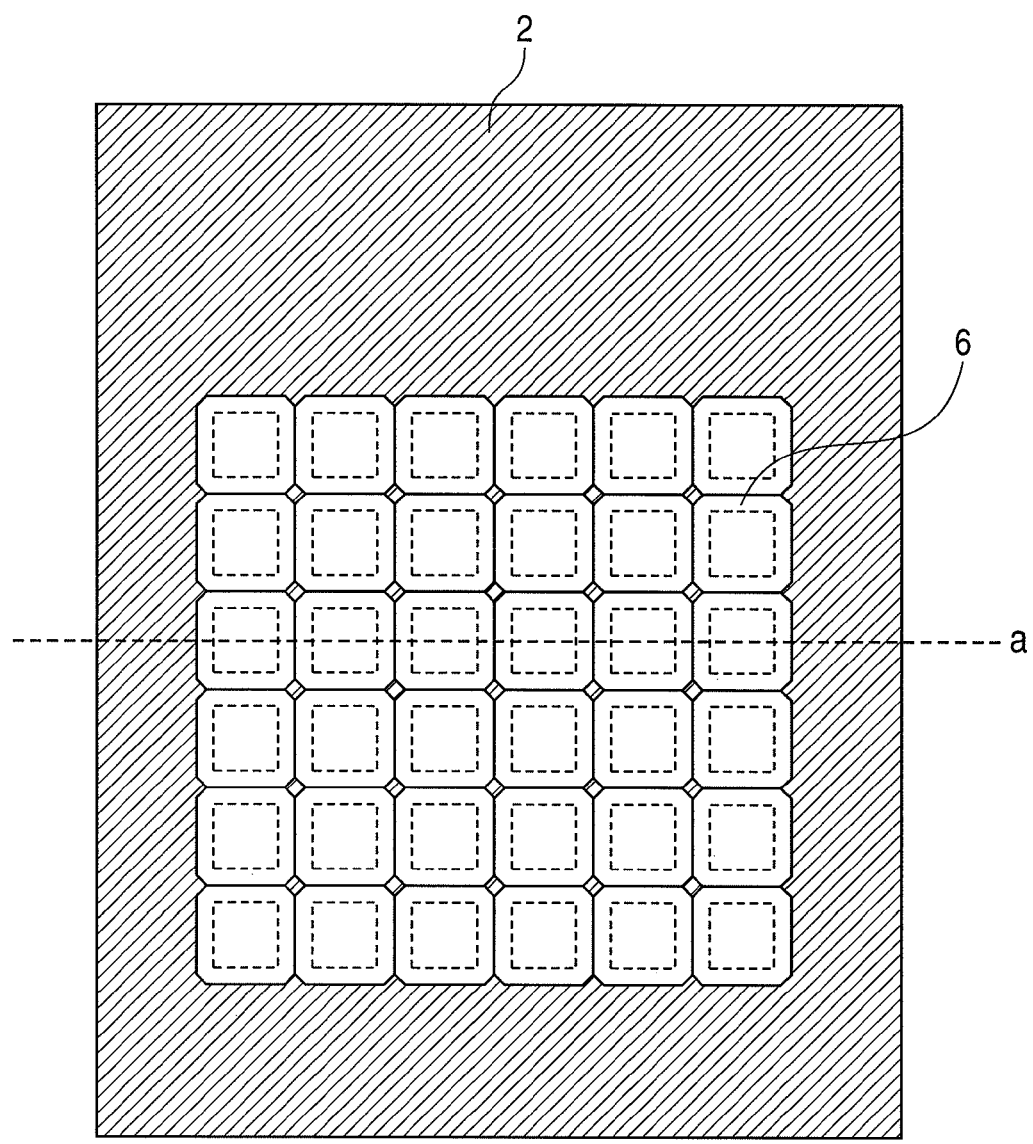
FIG. 11B is a plan view showing a method of manufacturing a semiconductor photodiode device in the first embodiment successively.

Successively, growing is stopped just before the coalescence of Ge islands 5 to each other. In this embodiment, growing is stopped when the spacing is reduced to about 0.3 μm or less. Then, a low temperature Ge layer 6 is epitaxially grown by about 300 nm at a low temperature of about 450° C. to obtain the structure shown in FIG. 10D. n-type doping is applied to the low temperature Ge layer 6. For example, phosphorus (P) or arsenic (As) is used as the n-type impurity and phosphine ($PH_3$) or arsine ($AsH_3$) diluted with hydrogen is used as the gas during growing. The impurity concentration in the low temperature Ge layer 6 is defined as about $1 \times 10^{20}$ $cm^{-3}$ by controlling the gas flow rate. The impurities in the low temperature Ge layer 6 are activated by the heat treatment to be described later so that electron-hole pairs, if generated due to defects, have no concerns with the dark current. In this embodiment, the growing temperature of the low temperature Ge layer 6 is set to a temperature higher by 100° C. compared with that for the low temperature Ge buffer layer 3. This is because the low temperature Ge layer 6 is formed in lattice matching with the Ge layer 5 different from the low temperature Ge buffer layer 3 growing above the Si substrate and, therefore, it is not necessary to introduce defects by so much as offsetting the effect of the underlayer inside the crystals. The low temperature Ge layer 6 is a layer which is formed with an aim of providing the function of confining only the defects generated upon coalescence of the Ge islands in the layer per se and not propagating them to the upper Ge layer. Accordingly, it is necessary to grow the low temperature Ge layer 6 so as to bury the spacing between the islands of the Ge layer 5 to each other. The surface structure in which the low temperature Ge layer 6 substantially buries the spacing between each of the Ge islands 5 is as shown in FIG. 11B. It should be noted that since the Ge growing rate is low in the <110> direction as the diagonal direction of the pattern, even when the spacing between each of adjacent Ge islands is buried, the region surrounded by four Ge islands is not buried completely. The film thickness 300 nm of the low temperature Ge layer 6 is decided while considering the phenomenon described above. It should be noted so that the islands coalesce to each other while keeping the side wall of the Ge layer 5 in the direction perpendicular to the Si substrate 1 during growing of the low temperature Ge layer 6 as described above. By keeping the side wall upon coalescence of the islands, defects generated in the low temperature Ge layer 6 by coalescence of the islands can extend only in the direction perpendicular to the Si substrate thereby capable of preventing increase of the defect density.

Figure 10E:
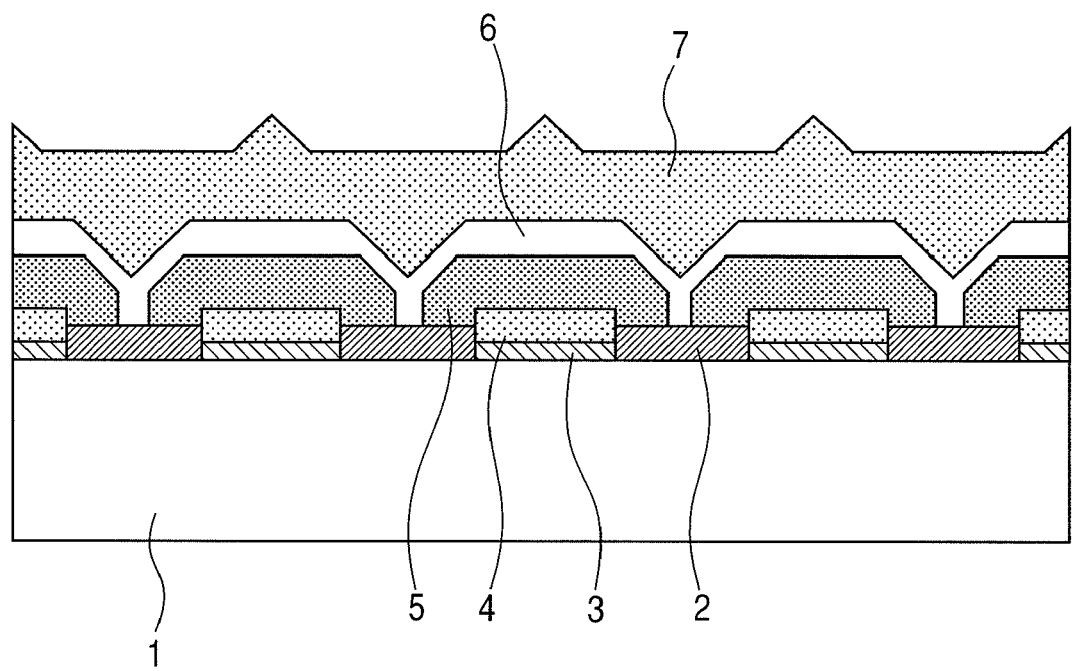
FIG. 10E is a cross sectional view showing a method of manufacturing a semiconductor-photodiode device in the first embodiment, successively.
Figure 10F:
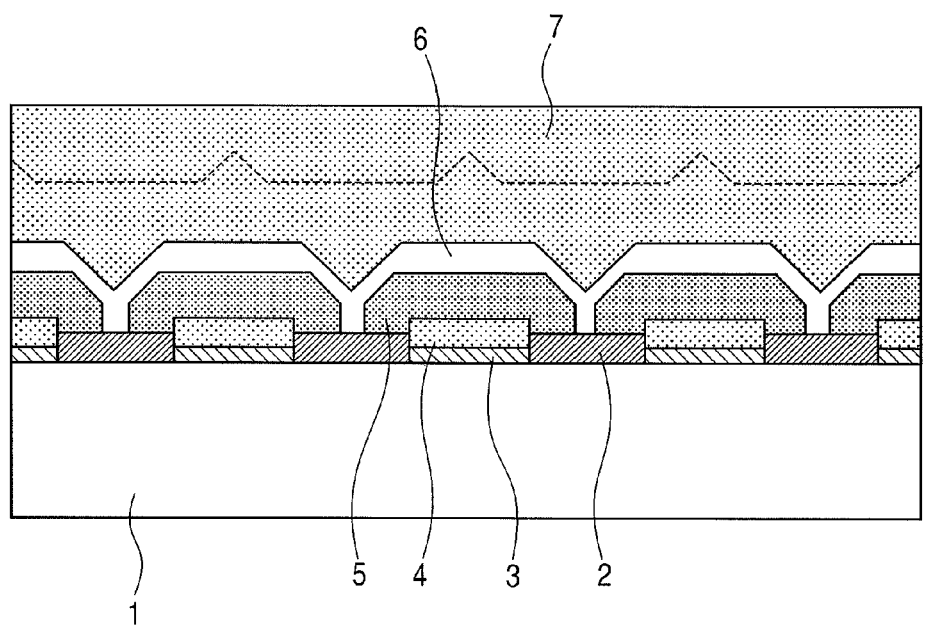
FIG. 10F is a cross sectional view showing a method of manufacturing a semiconductor photodiode device in the first embodiment, successively.
Figure 12:
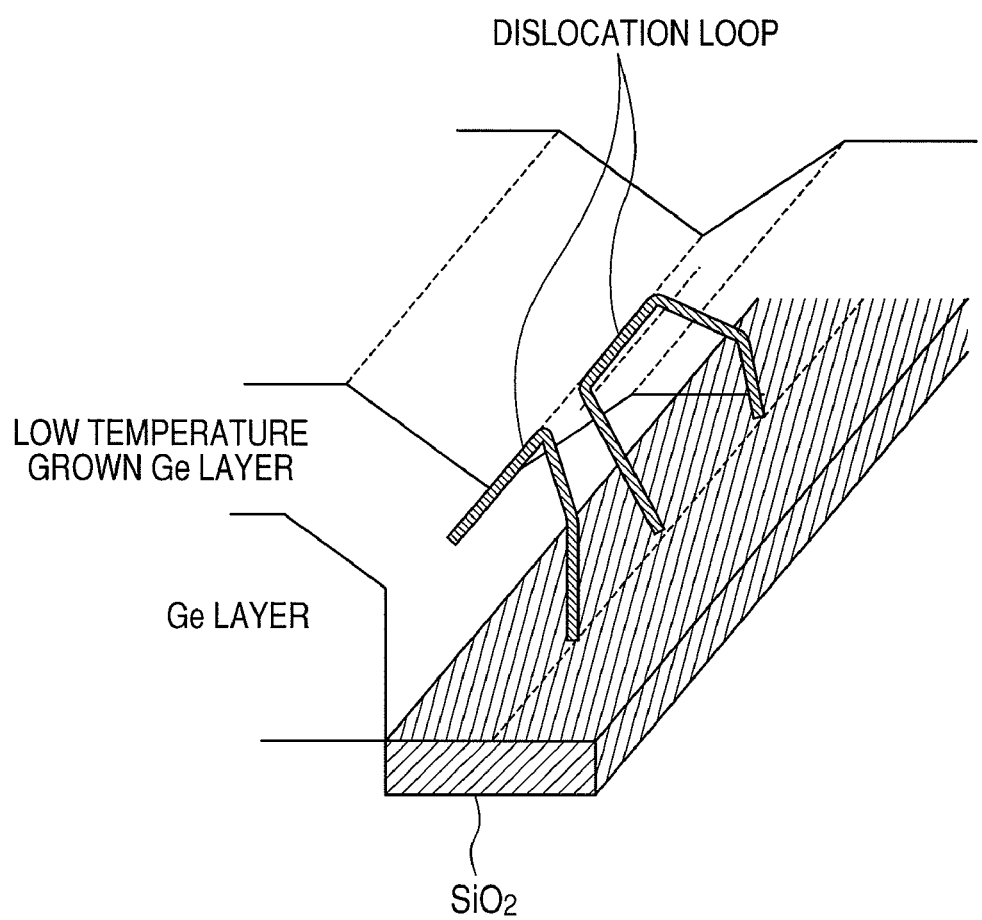
FIG. 12 is a bird's eye view showing a defect eliminating process in the first embodiment.

Then, a high concentration n-type Ge layer 7 is grown selectively to obtain a structure shown in FIG. 10E and FIG. 10F. Growing in this process is conducted till the high concentration n-type Ge layer 7 buries the unevenness in the underlayer to restore the planarity. The plurality restoring process is as described below. When the pattern is oriented to <100> plane, since the growing rate of the (101) plane formed as a facet is grown at a rate lower than that of the (001) plane on the surface of the substrate and that of the (100) plane in the direction parallel to the substrate, the planar portion burying the spacing between the islands of the Ge layer 5 gradually increases the area along with growing and the planar portion present above the island of the Ge layer 5 decreases the area along with growing. Therefore, the area for the planar portion which is based above the island of the Ge layer 5 is reduced to 0 at a certain film thickness as shown in FIG. 10E. In this case, the growing rate at the apex of a pyramid above the Ge layer 5 is lowered compared with that at the (001) plane to restore the planarity of the Ge layer 7 (FIG. 10F). Subsequently, by applying a heat treatment of ascending and descending the temperature between 900° C. and 780° C. for ten times each time for 10 min as described above, the crystallinity of the Ge layer 7 is restored and the strain energy generated upon restoration of the crystallinity is confined in the low temperature grown Ge layer 6. Upon applying the heat treatment described above, it is important to confirm the planarity of the surface of the high concentration n-type Ge layer 7. That is, if facet remains even slightly, defects starting from the facet are generated due to the stress generated by the lowering of the temperature upon completion of growing. Accordingly, restoration of the planarity on the surface of the high concentration n-type Ge layer 7 is essential for forming the low defect density Ge photodiode device. FIG. 12 shows a schematic view in which defects are confined in the low temperature grown Ge layer 6 when the crystallinity of the high concentration n-type Ge layer 7 is restored by the heat treatment after forming the high concentration n-type Ge layer 7. In this case, two effects are utilized for the confinement of the defects. First, the propagation direction of defects is restricted to the direction perpendicular to the substrate thereby preventing increase of the defect density as described above. Secondly, defects can be confined selectively in the low temperature grown Ge layer 6 by weakening the crystal intensity of the low temperature grown Ge layer 6. By the combination of the two effects, the defect extending in the perpendicular direction from the boundary with $SiO_2$ is bent at the boundary with the Ge layer 7 as shown in FIG. 12. The defect proceeds as it is in the <100> direction, collides against another defect, forms a dislocation loop of stacking defect and disappears, or goes through to the outside of the substrate as it progresses in the direction parallel to the substrate. By the mechanism described above, defects can be confined in the low temperature grown Ge layer 6.

A step of fabricating a semiconductor photodiode device from a low defect density n-type Ge layer 7 shown in FIG. 10F is to be described below.

Figure 10G:
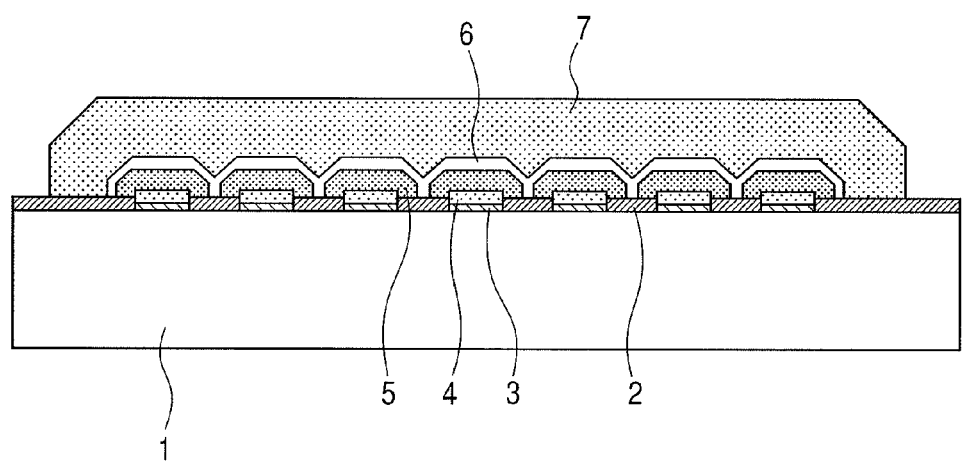
FIG. 10G is a cross sectional view showing a method of manufacturing a semiconductor photodiode device in the first embodiment, successively.

FIG. 10G is a cross sectional view showing an entire high concentration n-type Ge layer 7.

Figure 10H:
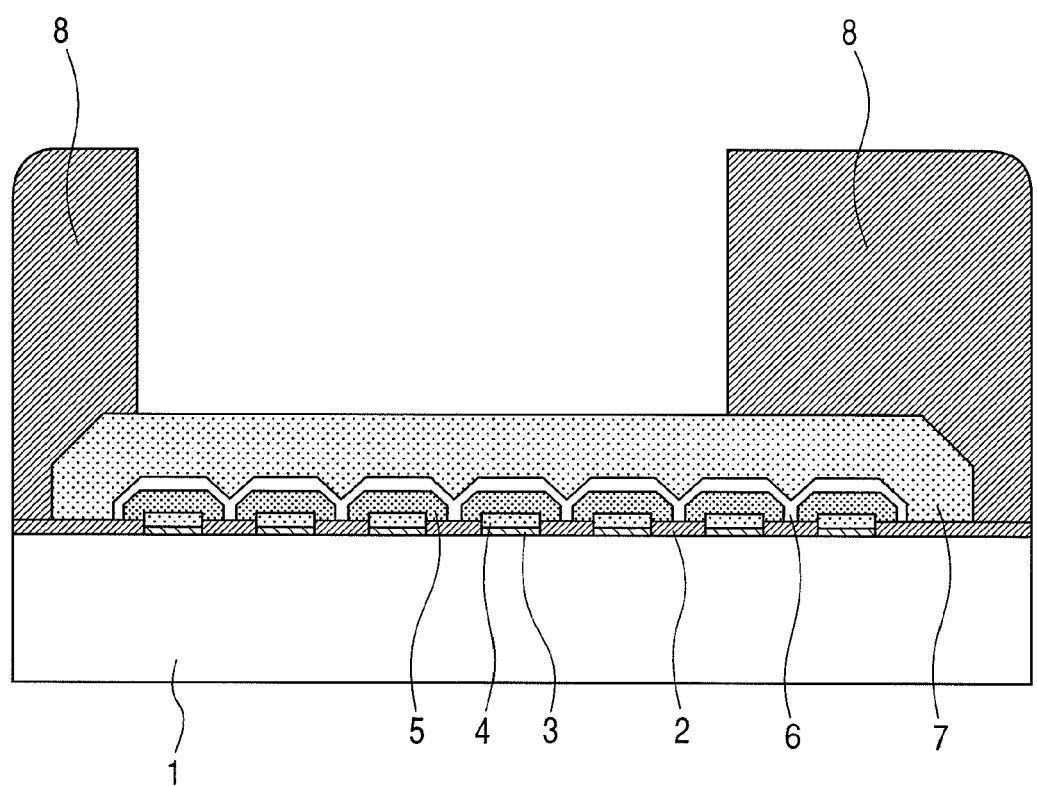
FIG. 10H is a cross sectional view showing a method of manufacturing a semiconductor photodiode device in the first embodiment, successively.

Then, an insulating film 8 is deposited and a photodiode device forming portion is opened by patterning to obtain a structure of FIG. 10H.

An $SiO_2$ film is preferably used for the insulating film 8 and it is preferably fabricated by dry etching.

Figure 10I:
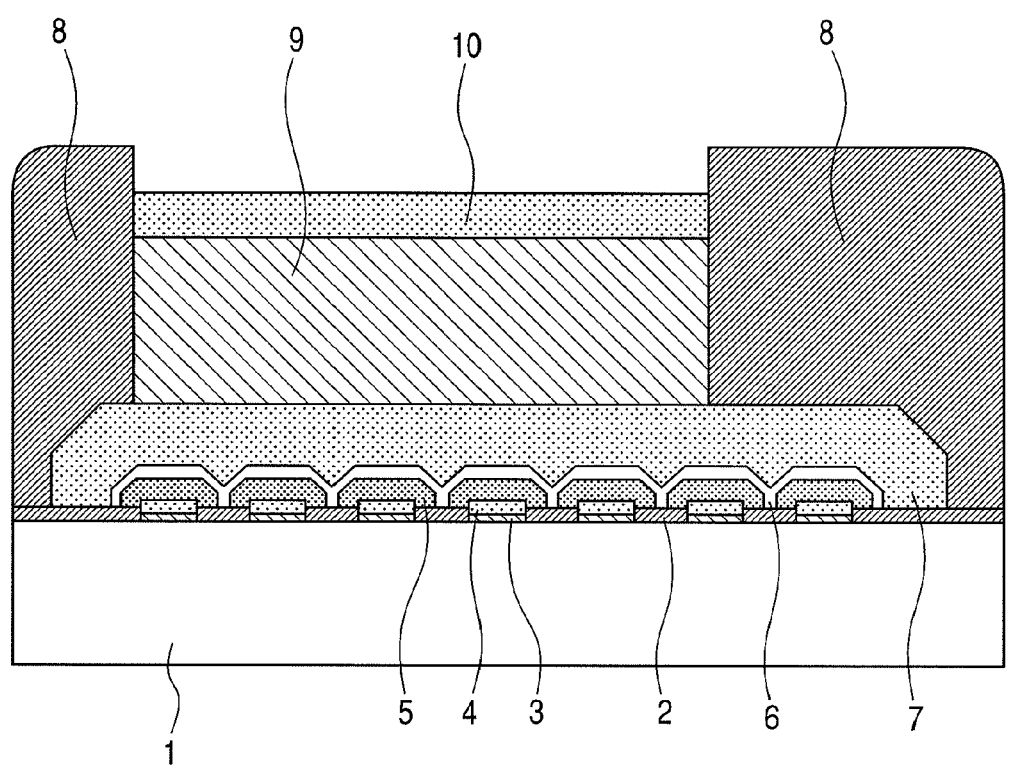
FIG. 10I is a cross sectional view showing a method of manufacturing a semiconductor photodiode device in the first embodiment, successively.

Then, a high resistance Ge layer 9 and a high concentration p-type Ge layer 10 are formed continuously by selective epitaxial growing to obtain a structure of FIG. 10I. In this process, care should be taken so that the impurity concentration of the high resistance Ge layer 9 is about at $1 \times 10^{17}$ cm$^{-3}$ and the light absorption layer is sufficiently depleted. The thickness of the high resistance Ge layer 9 is defined as about 1 to 2 μm which is a light absorption length of Ge in a 1550 nm wavelength band used for long distance communication. For the impurity of the high concentration p-type Ge layer 10, boron (B) using diborane ($B_2H_6$) as the starting gas is used and the impurity concentration is defined as $1 \times 10^{20}$ cm$^{-3}$. In this case, it should be noted that the light-absorbing characteristics is deteriorated when the thickness of the high concentration p-type Ge layer 10 is excessively large. The film thickness of the high concentration p-type Ge layer 10 is defined as 100 to 200 nm in this embodiment.

Figure 10J:
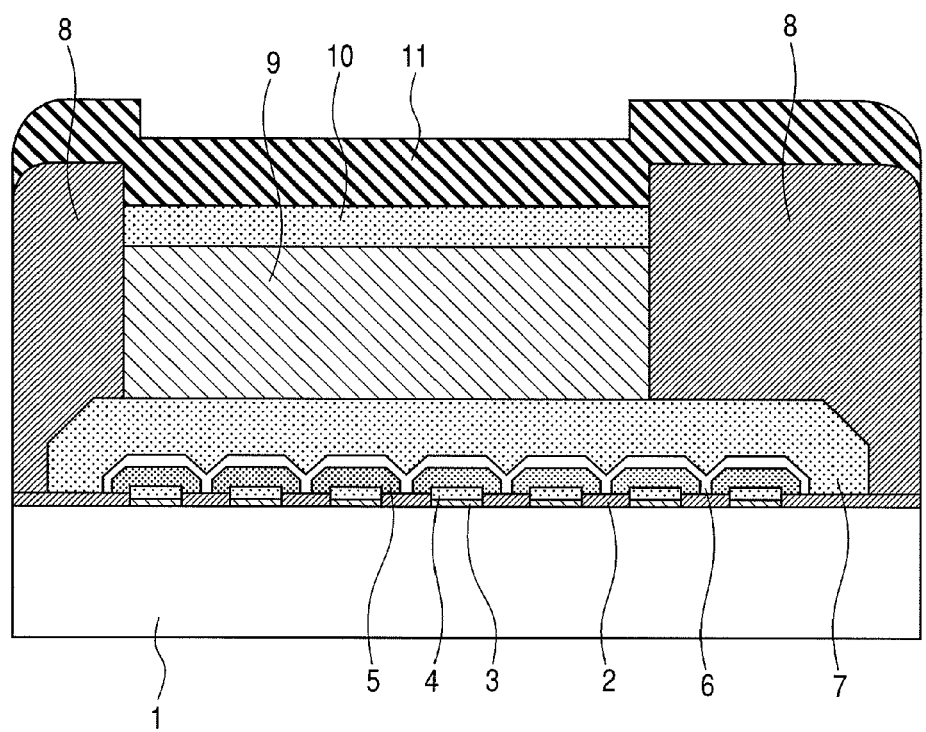
FIG. 10J is a cross sectional view showing a method of manufacturing a semiconductor photodiode device in the first embodiment, successively.
Figure 10K:
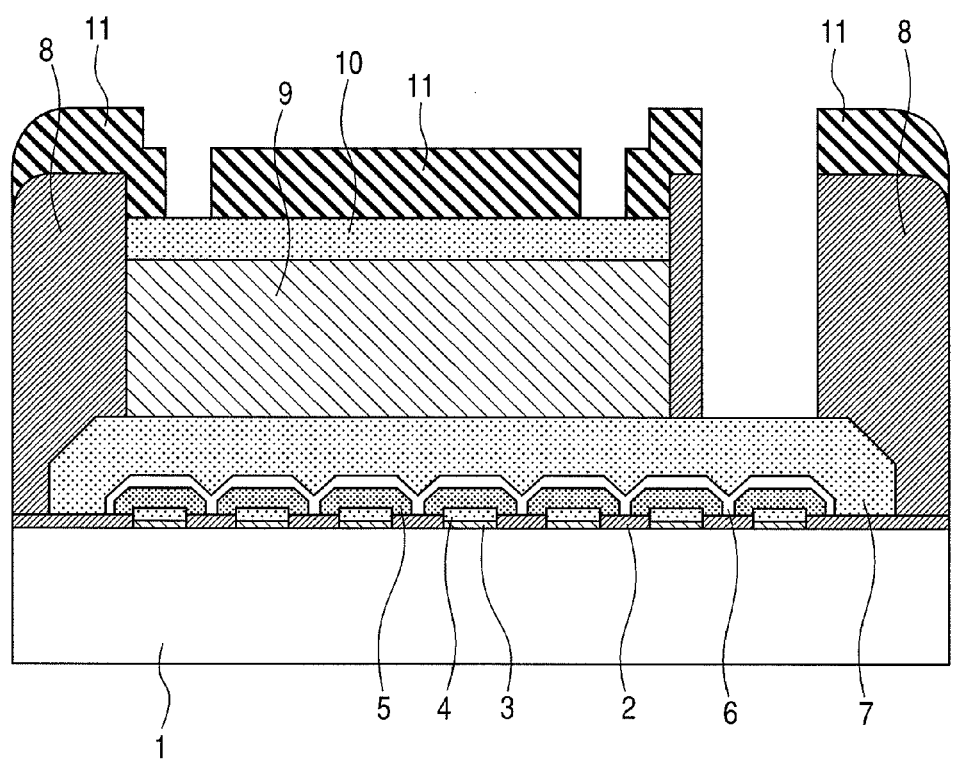
FIG. 10K is a cross sectional view showing a method of manufacturing a semiconductor photodiode device in the first embodiment, successively.

Then, an $Si_3N_4$ film 11 is deposited by about 700 nm over the entire surface (FIG. 10J). As described above, 2-dimensional tensile stress exerts on the Ge layer by the $Si_3N_4$ film and increase for the absorption of a long wavelength light due to decrease of the band gap can be expected.

Then, metal interconnection is formed above the insulating film. $Si_3N_4$ is fabricated above the photodiode portion by dry etching using sulfur hexafluoride ($SF_6$). For the patterning above the n-type Ge layer 7, after removing $Si_3N_4$, the underlying insulating film ($SiO_2$ film) 8 is etched and removed by using an etching gas containing a fluoro compound.

Figure 10L:
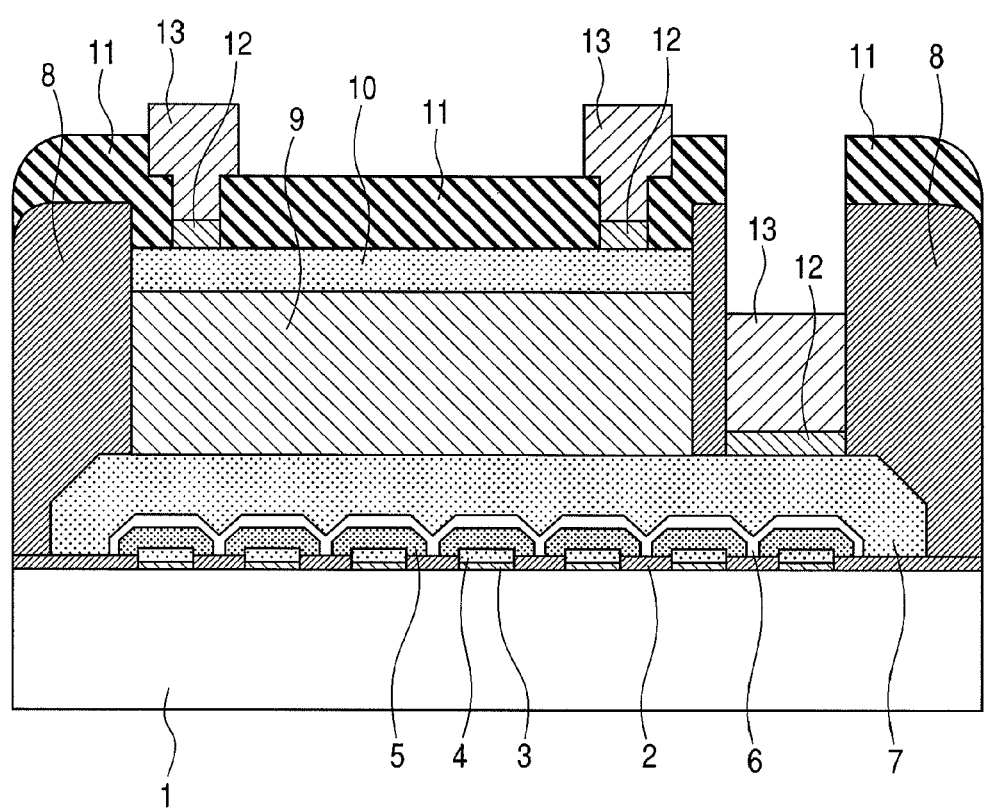
FIG. 10L is a cross sectional view showing a method of manufacturing a semiconductor photodiode device in the first embodiment, successively.
Figure 13:
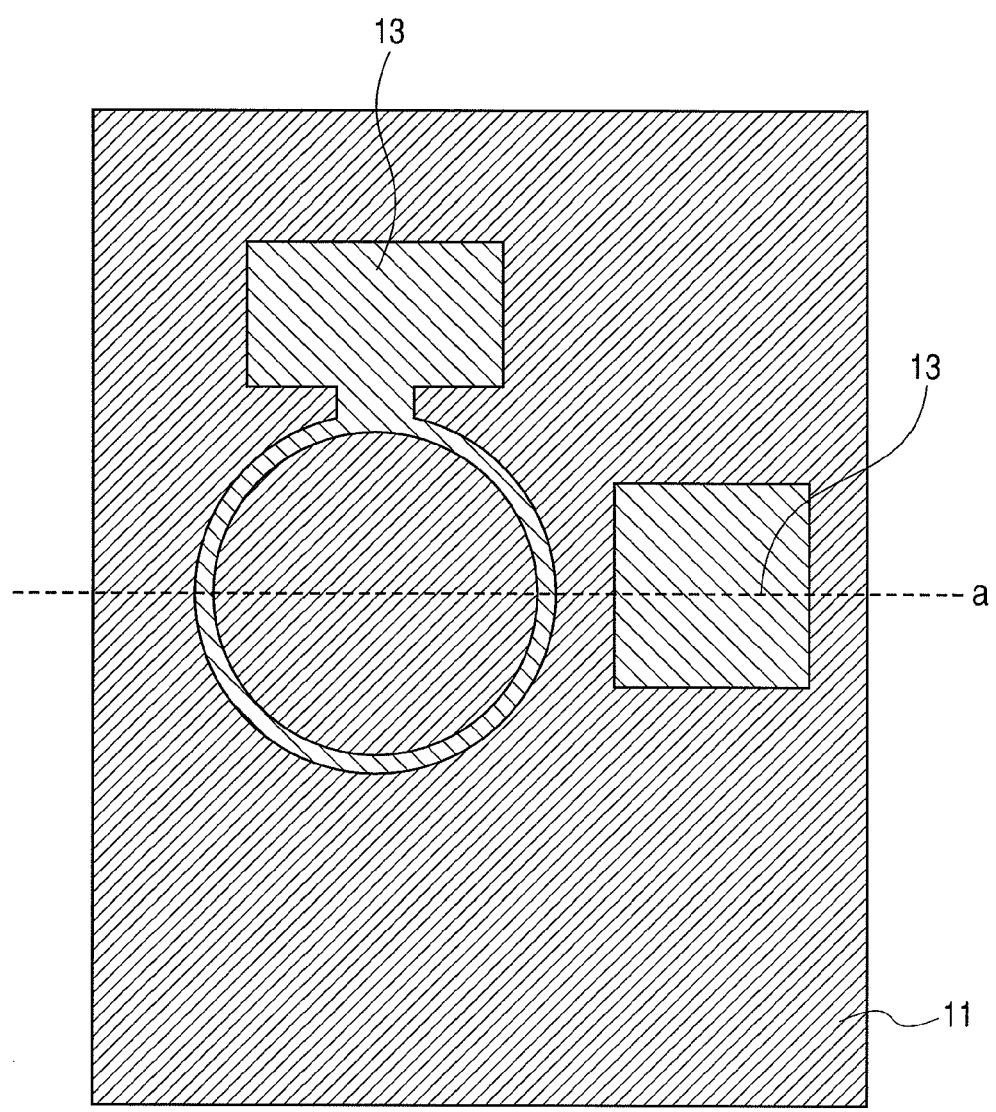
FIG. 13 is a plan view showing a semiconductor photodiode device in the first embodiment.

Finally, titanium nitride (TiN) and aluminum (Al) are formed by a sputtering method and fabricated by dry etching to obtain a complete structure shown in FIG. 10L. FIG. 13 shows a surface structure upon completion of the photodiode device. A segment a shown in FIG. 13 represents a line along which a cross sectional views shown in FIG. 10A to FIG. 10L are fractured. Since this embodiment is disclosed while considering the surface photoreceiving type device, the surface structure shown in FIG. 13 shows a structure in which a p-type electrode is in a ring shape. The diameter for the ring is preferably about 30 μm, for example, considering the application use to a long distance optical communication at 10 GHz.

According to the semiconductor photodiode device of this embodiment, it is possible to form Ge of good crystallinity for large area by suppressing generation of defects upon coalescence of Ge islands to each other by applying the Ge island at low defect density to seed crystals for lateral epitaxial grow the and using the buffer layer during formation of the Ge layer 7 above the Si substrate 1, and it is possible to manufacture a Ge photodiode device with less dark current above the Si substrate by establishing the process on the basis of the crystal forming technique described above.

While Ge is used for the light absorption layer in this embodiment, silicon-germanium (SiGe) which is mixed crystals with Si may also be used. By incorporating Si somewhat into crystals, the amount of lattice mismatching with the Si substrate can be decreased and this is somewhat advantageous with a view point of decreasing the crystal defect density. In this case, when the compositional ratio of Ge is defined as from 70 to 90%, high sensitivity can be maintained preferably also in optical communication at a long wavelength.

Further, in this embodiment, while the lower layer is formed of n-type Ge and the upper layer is formed of p-type Ge in the photodiode device, the lower layer may be formed of p-type Ge and the upper layer may be formed of n-type Ge in the photodiode device with no problems.

Further, while use of the surface photoreceiving type device is considered in this embodiment, the invention is applicable also to the waveguide type photodiode device while using the structure of this embodiment as it is.

Second Embodiment

Figure 14A:
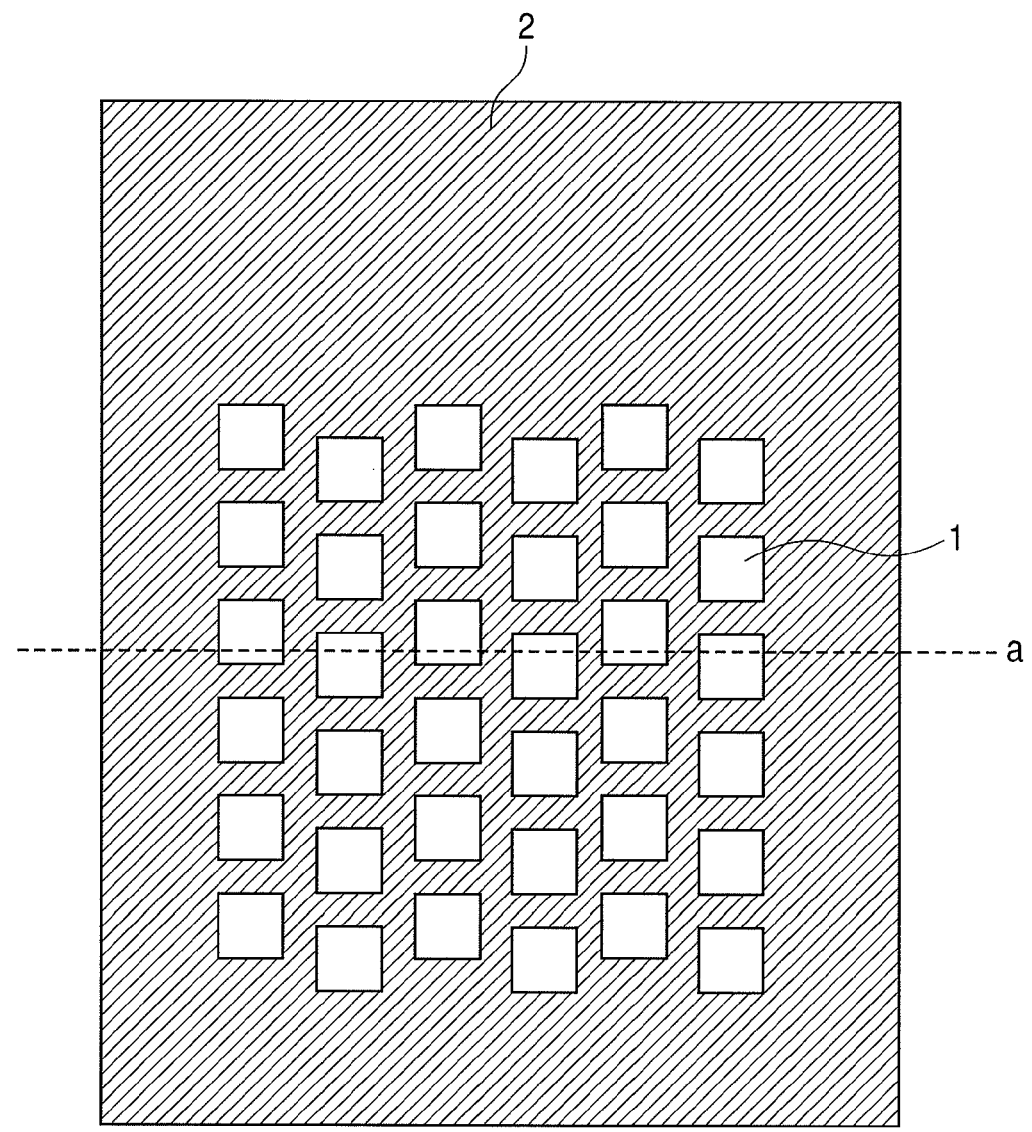
FIG. 14A is a plan view showing a crystal growing pattern in a second embodiment.
Figure 14B:
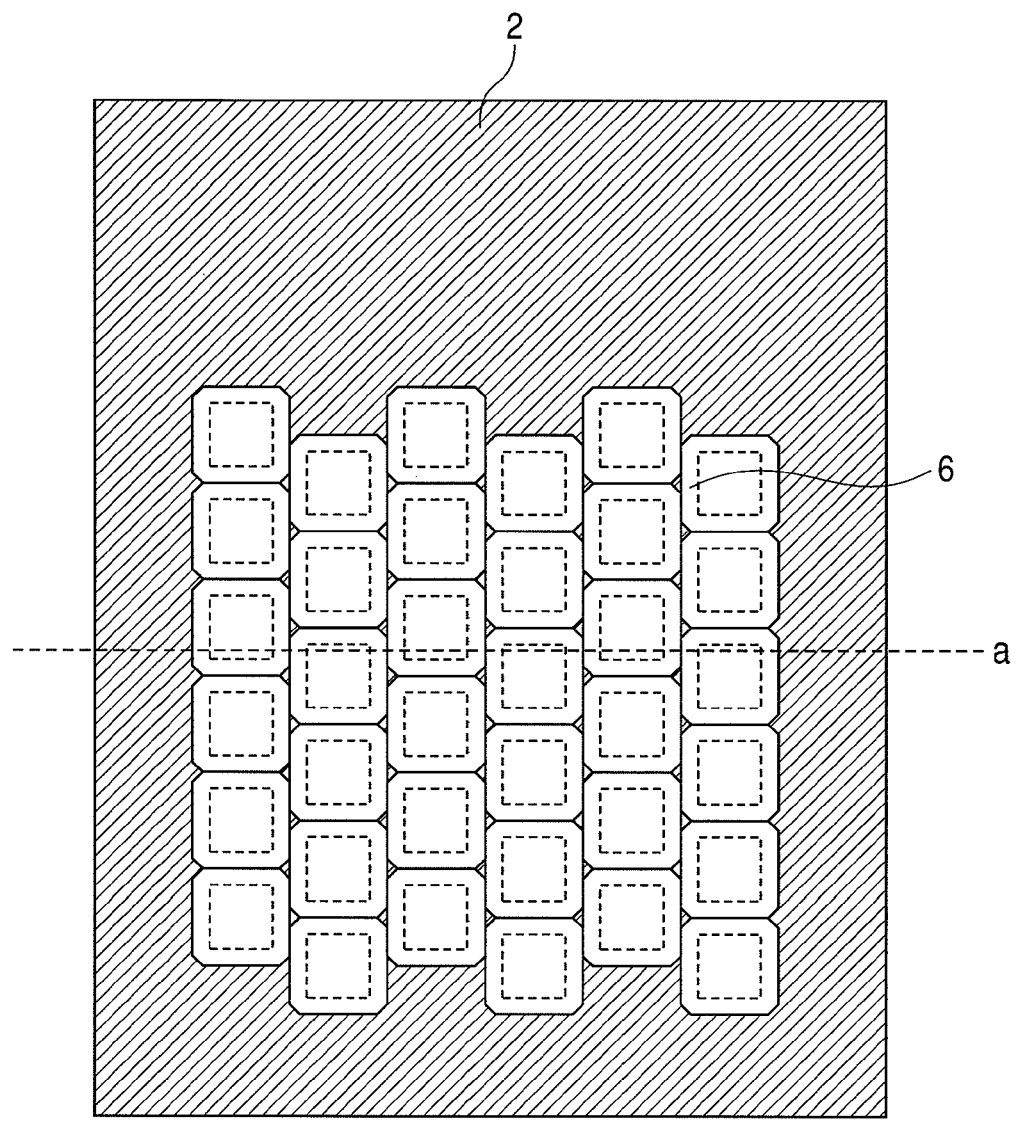
FIG. 14B is a plan view showing a crystal growing pattern in the second embodiment.

FIG. 14A and FIG. 14B are surface views showing a second embodiment of a semiconductor photodiode device according to the invention. FIG. 14A shows the surface after applying patterning for forming Ge islands above an Si substrate 1. FIG. 14A shows a characteristic feature that a repetitive pattern period of the Ge windows is off-set by one-half period. FIG. 14B shows a surface view in which a low temperature grown Ge layer 6 substantially buries Ge islands in the pattern shown in FIG. 14A. It can be seen that the area of the spacing remaining in the step where adjacent Ge islands coalesce to each other is decreased compared with that in the case of the first embodiment (FIG. 11B). Therefore, the thickness of the low temperature grown Ge layer 6 necessary for burying the spacing can be decreased. Since the defects incorporated in the film is decreased more as the thickness of the low temperature grown Ge layer 6 is decreased further the defect density can be decreased further by using this embodiment. The pattern orientation is preferably in the <100> direction at which the lateral growing rate is highest but the effect can be obtained also in the <110> direction as described above in the first embodiment.

Third Embodiment

Figure 15A:
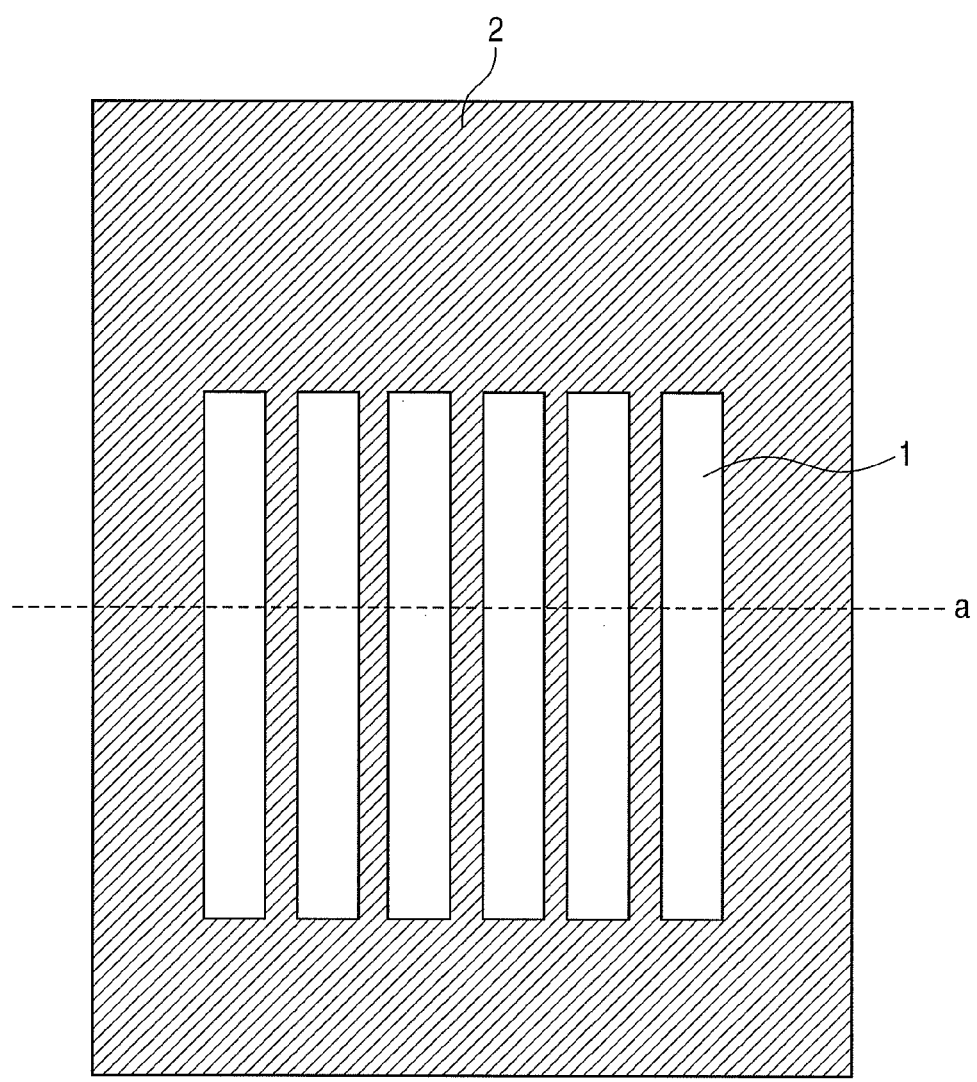
FIG. 15A is a plan view showing a crystal growing pattern in a third embodiment.
Figure 15B:
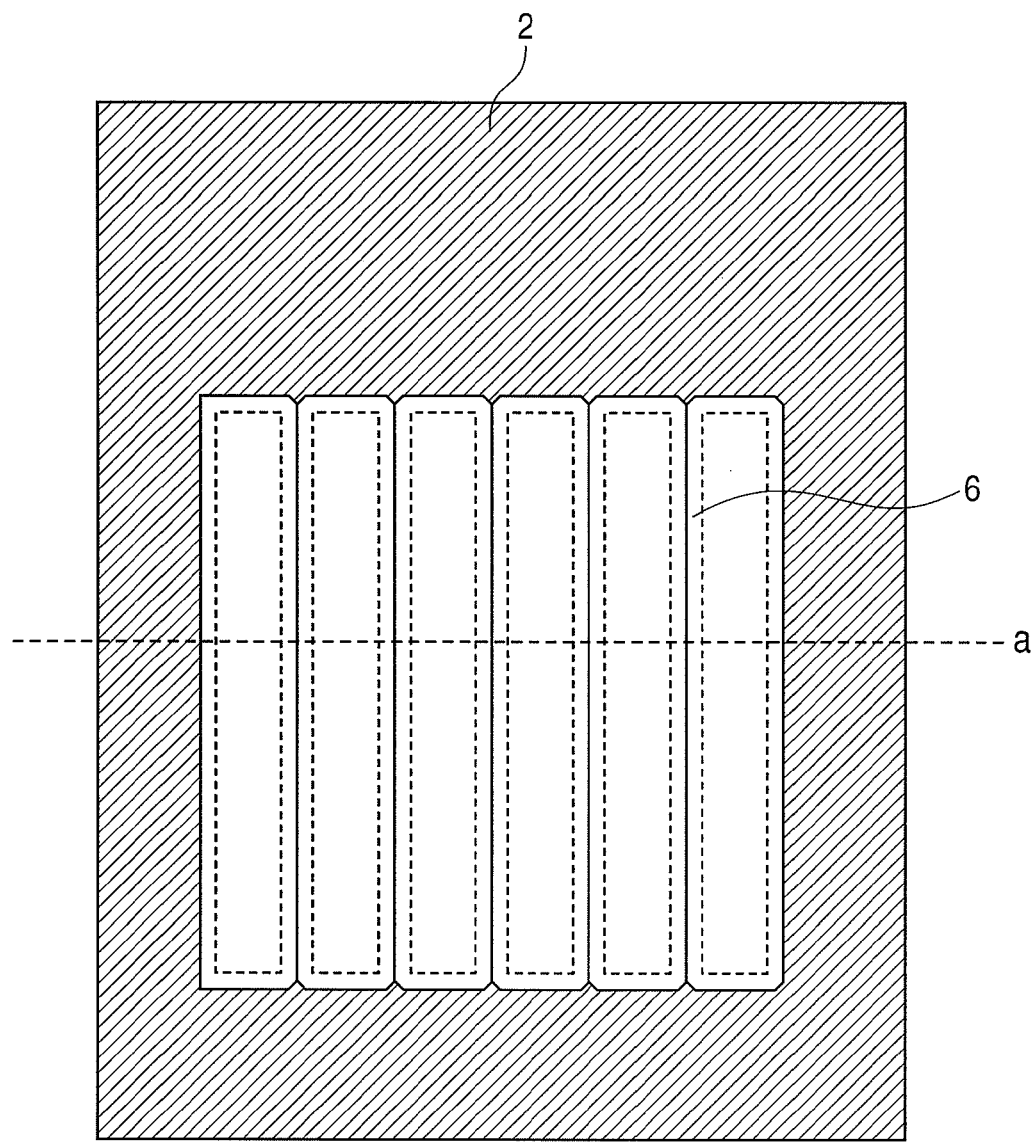
FIG. 15B is a plan view showing a crystal growing pattern in the third embodiment.

FIG. 15A and FIG. 15B are surface views showing a third embodiment of a semiconductor photodiode device according to the invention. FIG. 15A shows a surface after applying patterning for forming a Ge island above an Si substrate 1. The embodiment of FIG. 15A shows a characteristic feature that the Ge window has a rectangular shape having a length equal with the diameter of the window. According to this embodiment, the remaining spacing is eliminated at the instance adjacent Ge islands coalesce to each other (FIG. 15B). Accordingly, the thickness of the low temperature grown Ge layer 6 necessary for burying the spacing can be minimized, thereby enabling to decrease the crystal defect density in the low temperature grown Ge layer 6. However, if the diameter of the window is excessively long, the volume of the Ge buffer layer 3 and the Ge layer 4 formed in the window is increased making it difficult to sufficiently decrease the defects by the heat treatment after growing. Therefore, it is sometimes necessary, to divide the pattern into the longitudinal direction and adjust the longitudinal/lateral ratio of the pattern, for example, to 1:n (n is an integer) while considering the pattern density, growing rate, etc. In this case, it is more effective to adopt a form of off-setting the pattern period by one-half period as described in the second embodiment.

Fourth Embodiment

Figure 16:
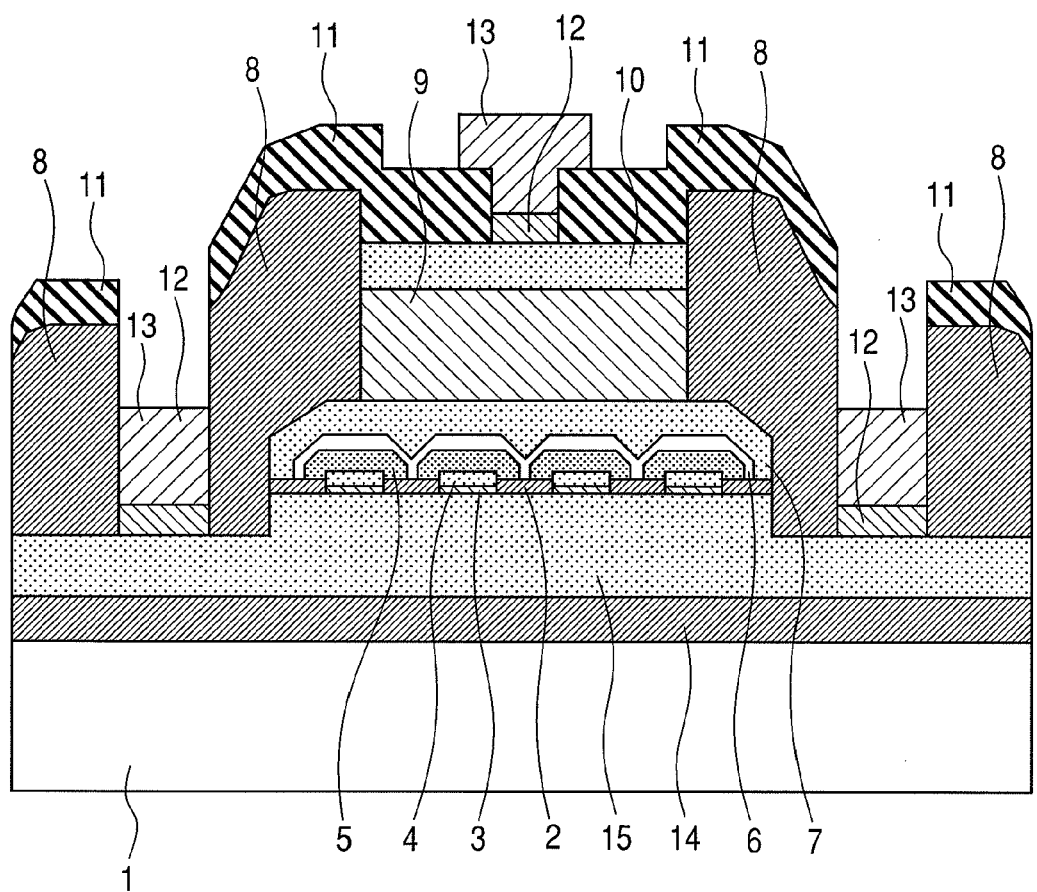
FIG. 16 is a cross sectional view showing a semiconductor photodiode device in a fourth embodiment.

This embodiment describes a device having an Si optical waveguide of Si and a low defect density Ge photodiode device in combination. FIG. 16 is a cross sectional view showing a fourth embodiment of the semiconductor photodiode device according to the invention.

This embodiment uses an SOI (Silicon On Insulator) substrate in which a buried oxide film 14 and an Si layer 15 are formed above an Si substrate 1. In the SOI substrate, the buried oxide film 14 has 1 μm thickness and the Si layer 15 as the upper layer has about 1.5 μm thickness. The Si layer 15 is patterned so as to provide a waveguide structure and etched by 0.6 μm at the periphery. A Ge photodiode device is fabricated above the Si waveguide. Since the fabrication method for the Ge photodiode device is identical with that of the existent example 1, description therefor is omitted and only the characteristic feature of the Ge photodiode device which is designed conforming to the form of the waveguide is to be described. This embodiment has a characteristic feature in that optical signals are incident on the side of the Si substrate. In this case, if the thickness of a high concentration n-type Ge layer 7 is large, light is decayed in the n-type Ge layer 7 and no sufficient photoreceiving efficiency can be obtained. Therefore, the size and the spacing of the Ge pattern are decreased to form a structure of suppressing the generation of unevenness by Ge islands. This embodiment is designed such that the pattern size is 300 nm and the pattern spacing is 300 nm for the window. This enables to suppress the total thickness of the high concentration n-type Ge layer 7 necessary for planarization to 200 nm. Therefore, according to this embodiment, a waveguide type photodiode device having a sufficient photoreceiving sensitivity can be attained.

Fifth Embodiment

This embodiment discloses a low defect density Ge photodiode device in which p-type and n-type electrodes are formed by ion implantation.

Figure 17:
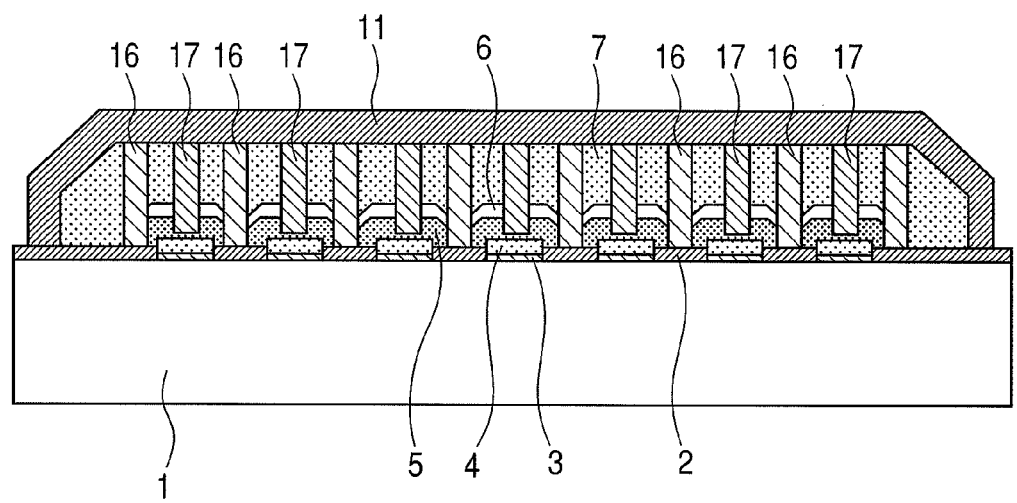
FIG. 17 is a cross sectional view showing a semiconductor photodiode device in a fifth embodiment.
Figure 18:
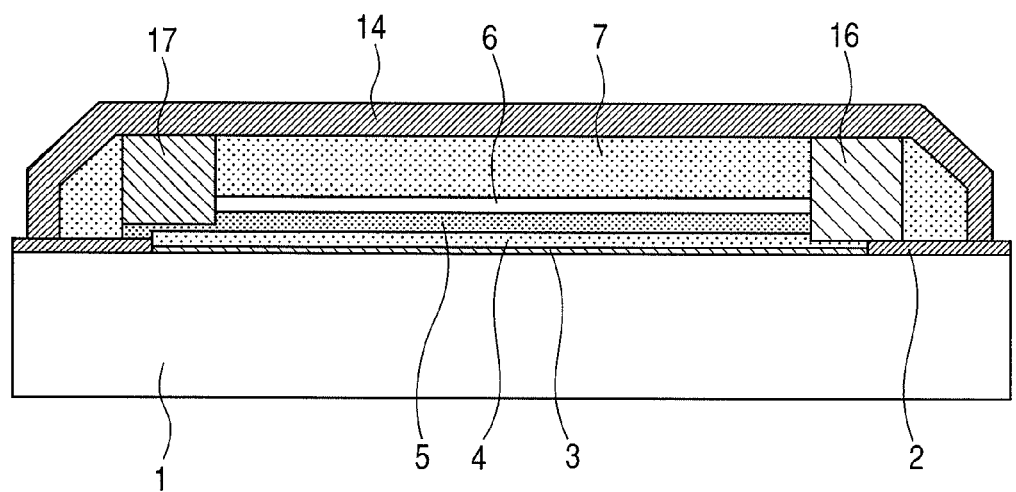
FIG. 18 is a cross sectional view showing a semiconductor photodiode device in the fifth embodiment.
Figure 19:
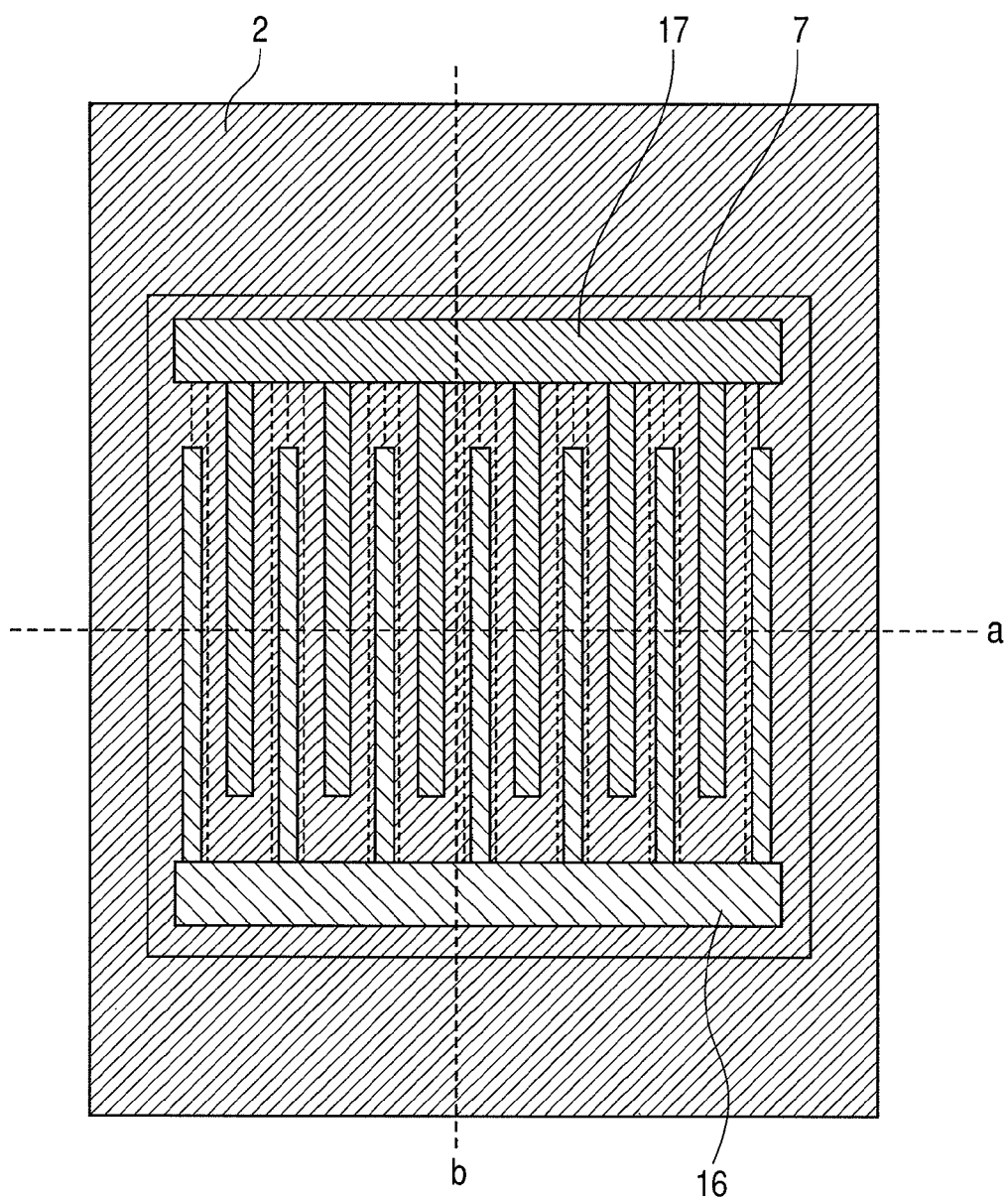
FIG. 19 is a plan view showing a semiconductor photodiode device in the fifth embodiment.

FIG. 17 to FIG. 19 are cross sectional views and a planar view showing a fifth embodiment of a semiconductor photodiode device according to the invention. In this embodiment, a rectangular stripe pattern disclosed in the fourth embodiment is adopted as a pattern that defines Ge islands. Steps for forming are performed by the same method as in the first embodiment as far as the formation of the Ge layer 7. However, the Ge layer is not applied with doping and epitaxial growing conditions are controlled such that the impurity concentration in all of the Ge layers is about $1 \times 10^{17}$ cm$^{-3}$. In this embodiment, since the high resistance Ge layer 7 has a role as a light absorption layer, the thickness of the high resistance Ge layer 7 is defined as about 1 to 2 μm.

After forming the high resistance Ge layer 7, an insulating film 18 is formed over the entire surface. The insulating film 18 is preferably formed of an SiO$_2$ film. Then, p-type and n-type ions are implanted. FIG. 17 to FIG. 19 show cross sectional structures and a planar structure after implanting ions. FIG. 17 is a cross section taken along line a in FIG. 19 and FIG. 18 is a cross section taken along line b in FIG. 19. Ions are implanted while defining the implantation site corresponding to the pattern of the underlying Ge layer. Ions are implanted at the site of a coalescent portion between adjacent islands and the central portion of the island with an aim of forming a portion with a greatest incorporation of defects as a high concentration region. Ion implantation is set to the condition of injecting ions as far as a depth corresponding to the thickness of the Ge layer 7. In this case, the concentration in the defect containing region is increased making it possible to decrease the dark current. Further, by shortening the distance between the Ge islands, the inter p/n electrode distance can be shortened to shorten the carrier running time. Accordingly, high efficiency and high speed performance are made compatible.

Sixth Embodiment

In this embodiment, a low defect density Ge photodiode device formed above a silicon substrate with Ge islands formed by an enriched oxidation process as nuclei, and a manufacturing method thereof are to be described.

FIG. 20A to FIG. 20I are cross sectional structural views showing a sixth embodiment of a semiconductor photodiode device according to the invention.

Figure 20A:
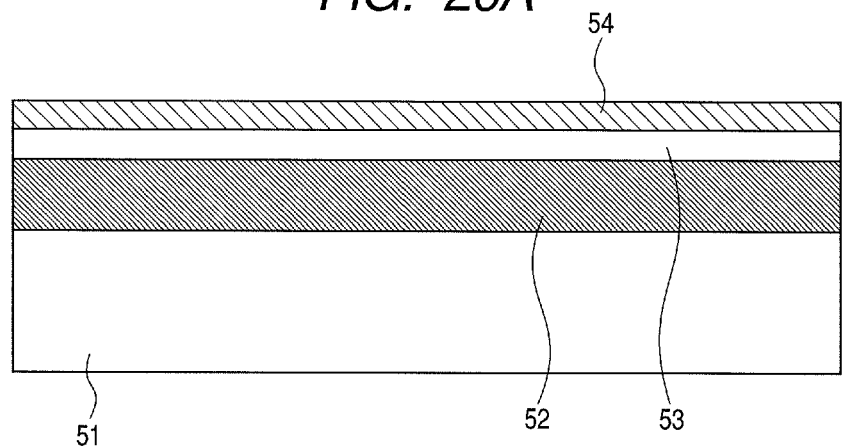
FIG. 20A is a cross sectional view showing a method of manufacturing a semiconductor photodiode device in a sixth embodiment successively.
Figure 20B:
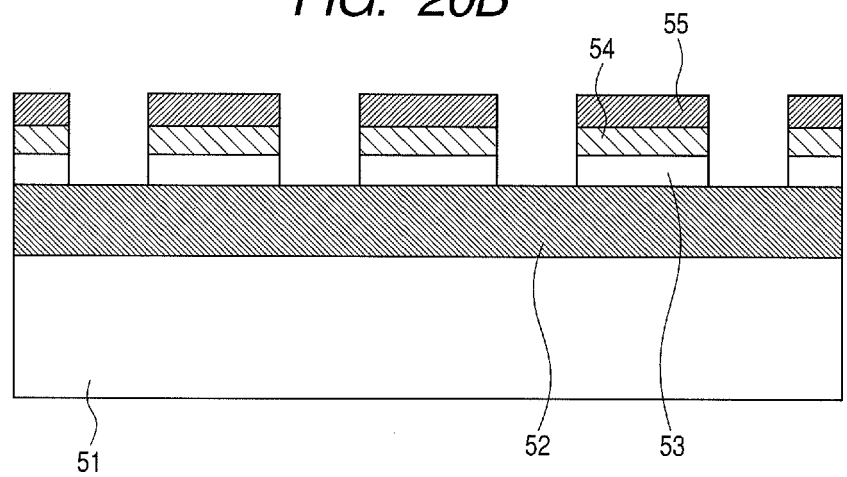
FIG. 20B is a cross sectional view showing a method of manufacturing a semiconductor photodiode device in the sixth embodiment successively.

An SiGe layer 54 is formed by epitaxial growing above an SOI substrate in which an SiO$_2$ film 52 and an Si layer 53 are disposed above an Si substrate 51 to obtain a structure in FIG. 20A. The SiGe layer 54 is formed while lattice matching with the Si layer 53, and it is formed as a film containing the strain energy in inside thereof but free of defects by decreasing the thickness to a critical thickness or less that causes strain moderation. The Ge composition ratio of the SiGe layer 54 is defined as 15%. When the growing temperature during epitaxial growing is set to a temperature of about 600° C., the SiGe layer 54 can be formed with no defects up to a thickness of about 100 nm.

Then, after depositing an insulating film 55, patterning is applied to partially remove the insulating film by dry etching or wet etching. As has been described above in the existent example 1 or the existent examples 2, 3, it is necessary that the patterning has a lattice-like or comb-like shape, and the patterning is applied preferably in <100> orientation. Subsequently, the SiGe layer 54 and the Si layer 53 are removed by etching using the insulating film 55 as a mask to obtain a structure shown in FIG. 20B. When dry etching is applied by using a gas mixture of hydrogen bromide (HBr) and chlorine ($Cl_2$) for etching, anisotropic etching is possible. However, since damages on the side wall may possibly generate defects upon enriched oxidation, wet etching using an alkali type etching solution may also be conducted. As the etching solution to be used, a strong alkaline solution such as an aqueous solution of potassium hydroxide (KOH) or an aqueous solution of tetramethyl ammonium hydroxide (TMAH) is preferred, in which wet etching using $SiO_2$ as an etching stopper is possible.

Figure 20C:
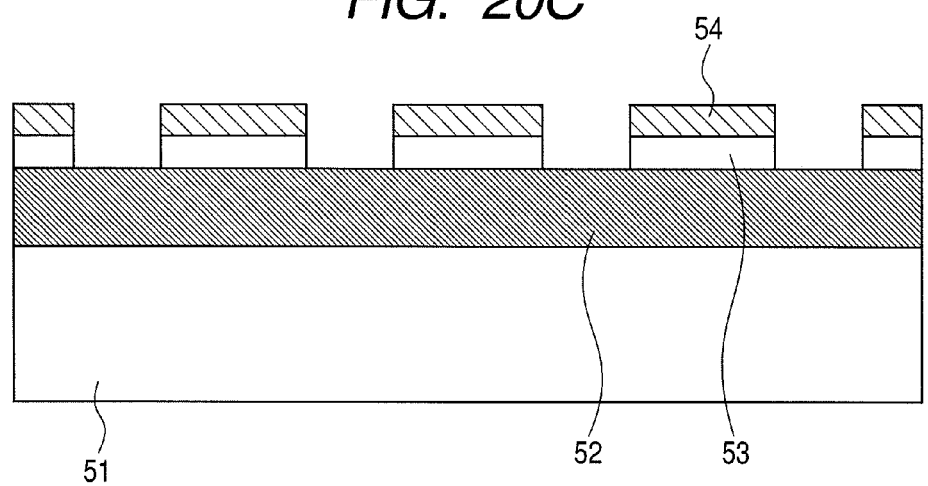
FIG. 20C is a cross sectional view showing a method of manufacturing a semiconductor photodiode device in the sixth embodiment successively.
Figure 20D:
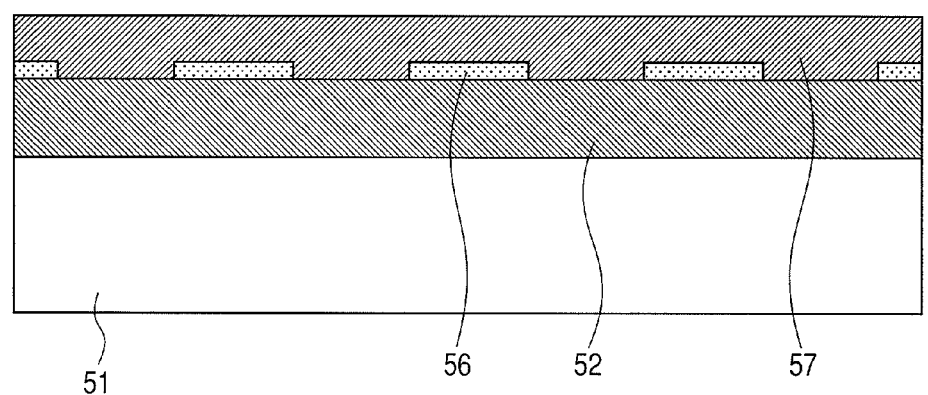
FIG. 20D is a cross sectional view showing a method of manufacturing a semiconductor photodiode device in the sixth embodiment successively.

Subsequently, the insulating film 55 on the surface is removed by wet etching to obtain a structure shown in FIG. 20C.

Then, enriched oxidation is carried out at a temperature of 1000° C. or higher. In this process, only Si in the Si layer 53 and the Si—Ge layer 54 is selectively oxidized and Ge atoms are deposited toward the buried oxide film 52. When enriched oxidation is carried out, a moderation Ge layer 56 of about 20 nm is formed being put between the buried oxide film 52 and the oxide film 57. The Ge layer 56 has more enhanced crystallinity as the patterned size of the initial Ge layer 54 is smaller, and the crystal defect density can be decreased to $1 \times 10^4$ cm$^{-3}$ or less at the pattern width of 2 μm. Further, since the Ge layer 56 moderates energy while sliding over the underlying buried oxide film 52 during enriched oxidation, strains in the Ge layer 56 can be moderated completely.

Figure 20E:
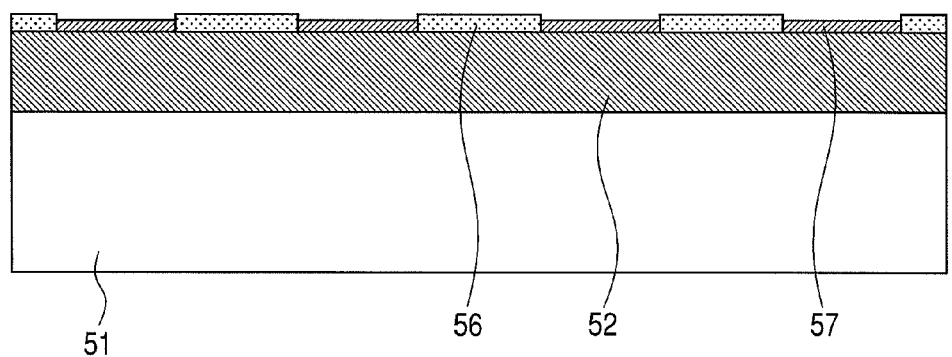
FIG. 20E is a cross sectional view showing a method of manufacturing a semiconductor photodiode device in the sixth embodiment successively.

Then, the oxide film 57 is wet etched to expose the surface of the moderation Ge layer 56 to obtain a structure shown in FIG. 20E. In this case, for accelerating the epitaxial lateral growth, the etching amount is controlled so as to expose the side wall of the Ge layer 56.

Figure 20F:
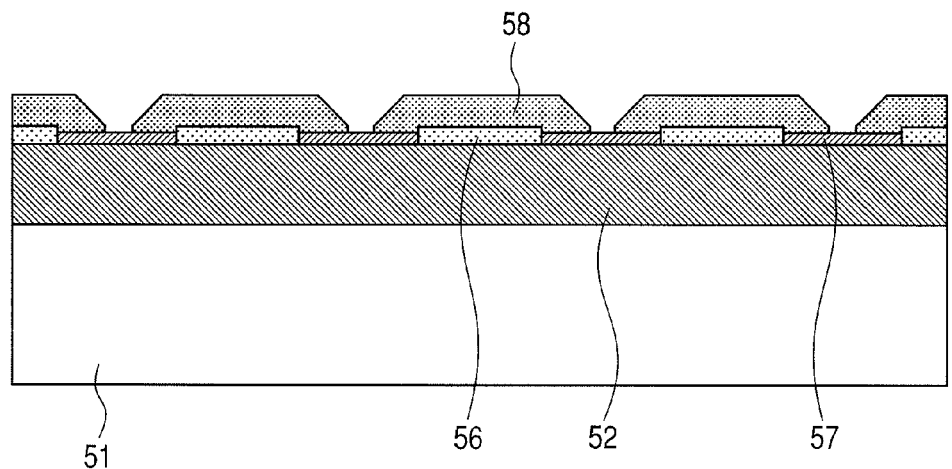
FIG. 20F is a cross sectional view showing a method of manufacturing a semiconductor photodiode device in the sixth embodiment successively.

Then, as shown in FIG. 20F, an n-type Ge layer 58 is epitaxially grown selectively on the Ge layer 56. The Ge layer 58 is epitaxially grown laterally and increases the size in the horizontal direction. In this embodiment, since the initial thickness of the Ge island 56 is small, a side wall vertical to the substrate cannot be kept, and the side wall on the Ge layer 58 includes only the facet plane in the direction oblique to the substrate as shown in FIG. 20F.

Figure 20G:
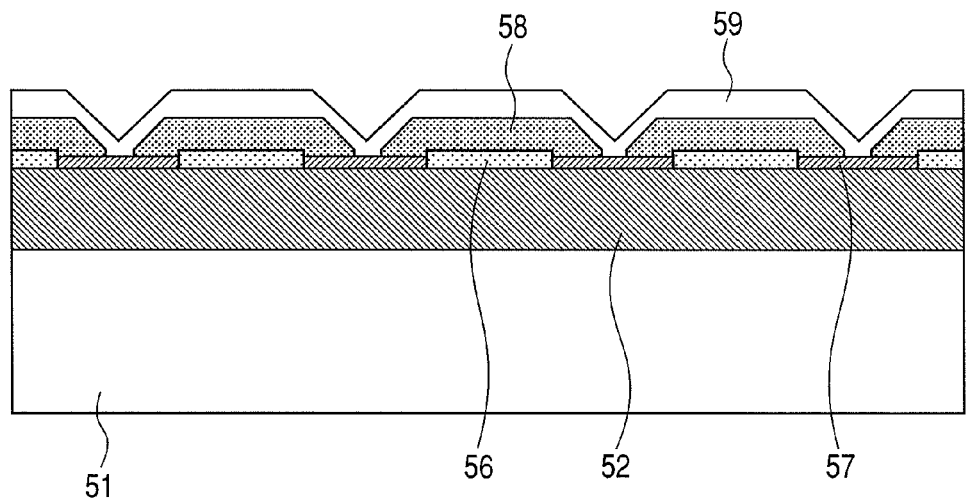
FIG. 20G is a cross sectional view showing a method of manufacturing a semiconductor photodiode device in the sixth embodiment successively.

Subsequently, an n-type low temperature Ge layer 59 is epitaxially grown at a low temperature of 450° C., to obtain a structure shown in FIG. 20G. For the impurities in the low temperature Ge layer 59, P or As may be added by about $1 \times 10^{20}$ cm$^{-3}$ as in the case of the first embodiment. While the low temperature Ge layer 59 is grown so as to bury the spacing between adjacent islands of the Ge layer 58, since the Ge layer 58 has no side wall in the direction perpendicular to the substrate in this embodiment, defects may possibly propagate along the facet in the low temperature Ge layer 59 and care should be taken upon growing of the low temperature Ge layer 59. In order to confine the defect propagating direction in the direction perpendicular to the substrate, it is necessary to increase the growing rate of the low temperature Ge layer 59 to the facet direction and it is important to control the growing rate by pressure control.

Figure 20H:
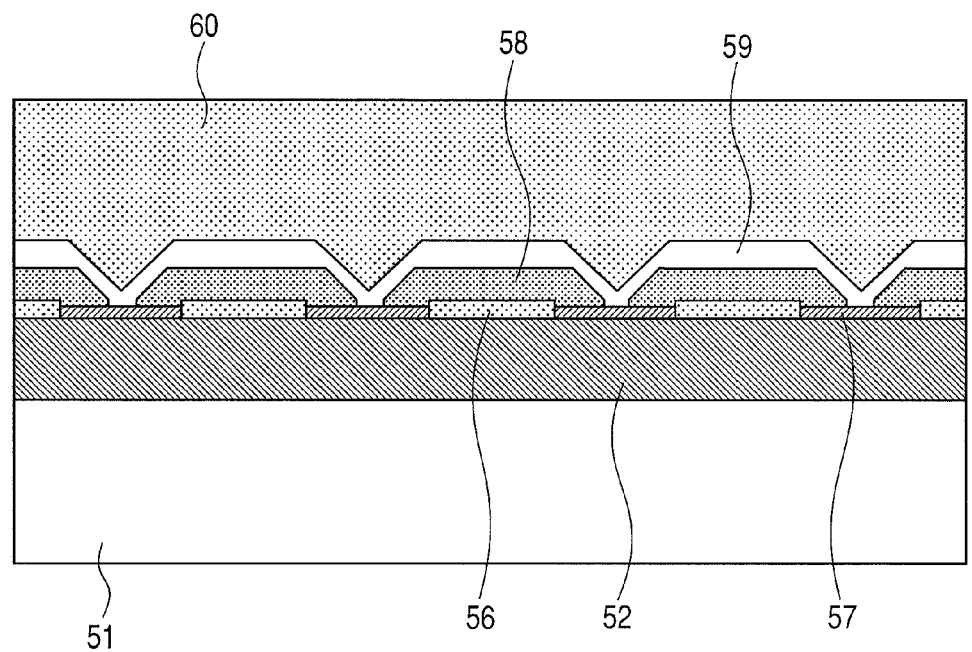
FIG. 20H is a cross sectional view showing a method of manufacturing a semiconductor photodiode device in the sixth embodiment successively.

After forming the low temperature Ge layer 59, a high concentration n-type Ge layer 60 is formed by epitaxial growing to obtain a structure shown in FIG. 20H. In the same manner as in the first embodiment, the high concentration n-type Ge layer 60 is grown till the surface is planarized.

Figure 20I:
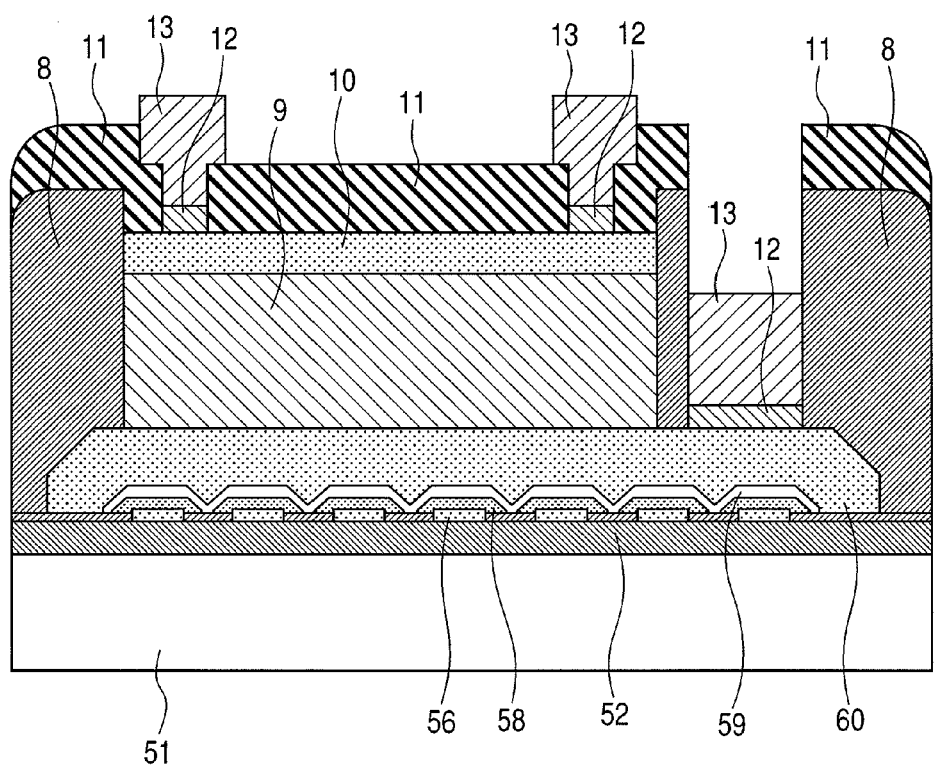
FIG. 20I is a cross sectional view showing a method of manufacturing a semiconductor photodiode device in the sixth embodiment successively.

Subsequently, like in the first embodiment, a high resistance Ge layer 9 and a p-type Ge layer 10 as a light absorption layer are formed by selective epitaxial growing and metal electrodes are fabricated to obtain a structure shown in FIG. 20I.

In this embodiment, since defect-free Ge layer 56 can be formed above the buried oxide film 52, it is possible to eliminate the low temperature buffer layer containing defects as in the case of the existent example 1. Therefore, a Ge photodiode device of less defects can be attained.

What is claimed is:

1. A semiconductor photodiode device comprising:
   a semiconductor substrate;
   a first buffer layer formed above the semiconductor substrate and containing a material different from that of the semiconductor substrate in a portion thereof;
   a first semiconductor layer formed above the buffer layer and having a lattice constant different from that of the semiconductor substrate;
   a second buffer layer formed above the first semiconductor layer and containing an element identical with that of the first semiconductor layer in a portion thereof; and
   a second semiconductor layer formed above the buffer layer,
   wherein a portion of the first semiconductor layer is formed of a plurality of island shape portions each surrounded with an insulating film, and
   wherein the second buffer layer allows adjacent islands of the first semiconductor layer to coalesce with each other and is in contact with the insulating film.

2. The semiconductor photodiode device according to claim 1,
   wherein the first semiconductor layer, the second buffer layer, and the second semiconductor layer have a first conduction type,
   wherein a third semiconductor layer of high resistance and containing an element identical with that of the second semiconductor layer is present above the second semiconductor layer, and
   wherein a second conduction type fourth semiconductor layer containing an element identical with that of the second semiconductor layer is present above the third semiconductor layer.

3. The semiconductor photodiode device according to claim 1,
   wherein a portion of the second buffer layer and a portion of the second semiconductor layer have a first conduction type in the vicinity of a portion of the second buffer layer in contact with the insulating film, and
   wherein a portion of the first semiconductor layer, a portion of the second buffer layer, and a portion of the second semiconductor layer have a second conduction type from the vicinity for the central portion of the island of the first semiconductor layer to a region thereabove.

4. The semiconductor photodiode device according to claim 1,
   wherein the first semiconductor layer includes a first portion in contact with the buffer layer and a second portion situated by way of the first portion on the side opposite to the semiconductor substrate, wherein the first portion is surrounded at the lateral surface thereof with the insulating film and the second portion, and wherein the second portion is in contact with the surface of the insulating film on the side opposite to the semiconductor substrate.

5. The semiconductor photodiode device according to claim 4, wherein the second portion of the first semiconductor layer, the second buffer layer, and the second semiconductor layer have a first conduction type, wherein a third semiconductor layer of high resistance and containing an element identical with that of the second semiconductor layer is present above the second semiconductor layer, and wherein a second conduction type fourth semiconductor layer containing an element identical with that of the second semiconductor is present above the third semiconductor layer.

6. The semiconductor photodiode device according to claim 5, wherein the semiconductor substrate includes silicon, wherein the first semiconductor layer and the second semiconductor layer include each single crystal germanium or single crystal silicon-germanium, and wherein the second buffer layer is formed at a low temperature and comprises germanium or silicon-germanium containing defects in the inside.

7. The semiconductor photodiode device according to claim 6, wherein the first buffer layer is a semiconductor layer formed at a low temperature in an opening window formed with the insulating film and containing defects in the inside, and wherein the constituent element of the first buffer layer is one of silicon, silicon-germanium, and germanium.

8. The semiconductor photodiode device according to claim 6, wherein the first buffer layer is present between the semiconductor substrate and the insulating film and comprises silicon dioxide.

9. The semiconductor photodiode device according to claim 4, wherein a portion of the second buffer layer and a portion of the second semiconductor layer have a first conduction type in the vicinity of a portion of the second buffer layer in contact with the insulating film, and wherein a portion of the first semiconductor layer, a portion of the second buffer layer, and a portion of the second semiconductor layer have a second conduction type from the vicinity for the central portion of the island of the first semiconductor layer to a region thereabove.

10. A semiconductor photodiode device according to claim 9, wherein the semiconductor substrate comprises silicon, wherein the first semiconductor layer and the second semiconductor layer comprises each single crystal germanium or single crystal silicon-germanium, and wherein the second buffer layer is formed at a low temperature and comprises germanium or silicon-germanium containing defects in the inside.

11. The semiconductor photodiode device according to claim 10, wherein the first buffer layer is a semiconductor layer formed at a low temperature in an opening window formed with the insulating film and containing defects in the inside, and wherein the constituent element of the first buffer layer is one of silicon, silicon-germanium, and germanium.

12. The semiconductor photodiode device according to claim 10, wherein the first buffer layer is present between the semiconductor substrate and the insulating film and includes silicon dioxide.

13. A method of manufacturing a semiconductor photodiode device comprising the steps of:

forming an opening window with an insulating film above a semiconductor substrate;

epitaxially growing a first buffer layer containing a material different from that of the semiconductor substrate in a portion thereof and a first semiconductor layer having a lattice constant different from that of the semiconductor substrate continuously in the window selectively and decreasing a crystal defect density in the first semiconductor layer by a heat treatment;

crystallographically growing the first semiconductor layer in a direction parallel to the surface of the semiconductor substrate thereby forming a plurality of island shape first semiconductor regions;

forming a first conduction type second buffer layer containing an element identical with that of the first semiconductor layer in a portion thereof by epitaxial growing and allowing adjacent islands each comprising the first semiconductor region to coalesce with each other; and forming a first conduction type second semiconductor layer by epitaxial growing above the second buffer layer and decreasing a crystal defect density in the second semiconductor layer by a heat treatment.

14. The method of manufacturing a semiconductor photodiode device according to claim 13, further comprising the steps of:

epitaxially growing a seventh semiconductor layer of high resistance and containing an element identical with that of the second semiconductor layer above the second semiconductor layer; and epitaxially growing a second conduction type eighth semiconductor layer containing an element identical with that of the second semiconductor layer above the seventh semiconductor layer.

15. The method of manufacturing a semiconductor photodiode device according to claim 13, further comprising the steps of:

implanting ions so as to make a portion of the second buffer layer and a portion of the second semiconductor layer to a first conduction type in the vicinity of a region where the second buffer layer allows the first or the second island shape semiconductor regions to coalesce with each other; and implanting ions so as to make a portion of the first semiconductor layer, a portion of the second buffer layer, and a portion of the second semiconductor layer to a second conduction type from the vicinity of a central portion for the island of the first semiconductor layer to a region thereabove.

16. A method of manufacturing semiconductor photodiode device comprising the steps of:

forming, above an imaginary substrate having a second insulating film and a third semiconductor layer formed above a semiconductor substrate, a fourth semiconductor layer having a lattice constant different from that of the semiconductor substrate by epitaxial growing;

selectively oxidizing only the element identical with the element constituting the semiconductor substrate present in the third semiconductor layer and the fourth semiconductor layer to obtain a fifth semiconductor layer;

crystallographically growing the fifth semiconductor layer in a direction parallel to the surface of the semiconductor substrate thereby forming a plurality of island shape second semiconductor regions;

forming a first conduction type third buffer layer containing an element identical with that of the fifth semiconductor layer in a portion thereof by epitaxial growing and allowing adjacent islands each comprising the second semiconductor region to coalesce with each other; and forming a first conduction type sixth semiconductor layer by epitaxial growing above the third buffer layer and decreasing a crystal defect density in the sixth semiconductor layer by a heat treatment.

17. The method of manufacturing a semiconductor photodiode device according to claim 16, further comprising the steps of:

epitaxially growing a seventh semiconductor layer of high resistance and containing an element identical with that of the second or the sixth semiconductor layer above the second or the sixth semiconductor layer; and epitaxially growing an eighth semiconductor layer of a second conduction type and containing an element identical with that of the second or the sixth semiconductor layer above the seventh semiconductor layer.

18. The method of manufacturing a semiconductor photodiode device according to claim 16, further comprising the steps of:

implanting ions so as to make a portion of the second or the third buffer layer and a portion of the second or the sixth semiconductor layer to the first conduction type in the vicinity of a region where the second or the third buffer layer allows the first or the second island shape semiconductor regions to coalesce with each other; and implanting ions so as to make a portion of the first or the fifth semiconductor layer, a portion of the second or the third buffer layer, and a portion of the second or the sixth semiconductor layer to the second conduction type from the vicinity for the central portion of the island of the first or the fifth semiconductor layer to a region thereabove.

* * * * *